(12) United States Patent
Halford

(10) Patent No.: US 10,599,511 B2
(45) Date of Patent: Mar. 24, 2020

(54) METHOD AND ARCHITECTURE FOR CRITICAL SYSTEMS UTILIZING MULTI-CENTRIC ORTHOGONAL TOPOLOGY AND PERVASIVE RULES-DRIVEN DATA AND CONTROL ENCODING

(71) Applicant: Chippewa Data Control LLC, Chippewa Falls, WI (US)

(72) Inventor: Robert J. Halford, Chippewa Falls, WI (US)

(73) Assignee: Chippewa Data Control LLC, Chippewa Falls, WI (US)

( * ) Notice: Subject to any disclaimer, the term of this patent is extended or adjusted under 35 U.S.C. 154(b) by 61 days.

(21) Appl. No.: 15/650,218

(22) Filed: Jul. 14, 2017

(65) Prior Publication Data

US 2018/0018216 A1    Jan. 18, 2018

Related U.S. Application Data

(60) Provisional application No. 62/362,918, filed on Jul. 15, 2016.

(51) Int. Cl.
*G06F 11/00* (2006.01)
*G06F 11/07* (2006.01)
(Continued)

(52) U.S. Cl.
CPC ........ *G06F 11/0793* (2013.01); *G06F 11/079* (2013.01); *G06F 11/0763* (2013.01);
(Continued)

(58) Field of Classification Search
CPC ............... G06F 11/0793; G06F 11/079; G06F 11/0739; G06F 11/0748; G06F 11/0763;
(Continued)

(56) References Cited

U.S. PATENT DOCUMENTS

| 4,644,538 A | * 2/1987 | Cooper | G05D 1/0077 700/79 |
|---|---|---|---|
| 7,103,824 B2 | 9/2006 | Halford | |

(Continued)

OTHER PUBLICATIONS

Babaie, Shahram, et al., Double Bits Error Correction Using CRC Method, 2009, IEEE (Year: 2009).*

(Continued)

*Primary Examiner* — Marc Duncan
(74) *Attorney, Agent, or Firm* — Padda Law Group; Michelle Dawson

(57) ABSTRACT

The present disclosure relates to novel and advantageous systems and methods of processing and managing data in critical or large-scale systems, such as airliner, automobile, space station, power plant, and healthcare systems. Particularly, the present disclosure relates to a rules-driven data and control method mapped onto complementary physical architecture for a more reliable operational system. By maintaining an algebraic encoding of control and application data at fine granularities, whether static or in transit, it is possible to detect, isolate, and correct many errors that would otherwise go undetected. This more dynamic and precise method addresses cases where deteriorating conditions or cataclysmic events affect much of the system simultaneously, including the control system itself.

20 Claims, 11 Drawing Sheets

(51) Int. Cl.
*H04L 1/00* (2006.01)
*G06F 11/14* (2006.01)
*H03M 13/19* (2006.01)
*G06F 17/10* (2006.01)
*G06F 17/11* (2006.01)

(52) U.S. Cl.
CPC ............... *G06F 11/14* (2013.01); *H04L 1/00* (2013.01); *H04L 1/004* (2013.01); *G06F 11/0739* (2013.01); *G06F 17/10* (2013.01); *G06F 17/11* (2013.01); *H03M 13/19* (2013.01)

(58) Field of Classification Search
CPC ............. G06F 11/3013; G06F 11/3048; G06F 11/3089; G06F 11/3093; G06F 11/34; G06F 11/08; G06F 11/10; H04L 67/12; H04L 67/125
See application file for complete search history.

(56) References Cited

U.S. PATENT DOCUMENTS

| | | | | |
|---|---|---|---|---|
| 7,813,831 | B2* | 10/2010 | McCoy | G06F 9/545 700/198 |
| 9,081,653 | B2* | 7/2015 | Ricci | G06F 17/00 |
| 9,697,072 | B2* | 7/2017 | Schoning | G06F 11/10 |
| 2009/0088089 | A1 | 4/2009 | Chandra et al. | |
| 2010/0095369 | A1 | 4/2010 | Gutt et al. | |
| 2013/0201316 | A1 | 8/2013 | Binder et al. | |
| 2016/0062330 | A1* | 3/2016 | Abe | G08C 17/02 700/12 |
| 2017/0006787 | A1* | 1/2017 | Weiler | A01G 25/16 |

OTHER PUBLICATIONS

International Search Report and Written Opinion for related PCT Application No. PCT/US2017/042134 dated Jan. 11, 2018 (11 pages).

Boeing, "Statisical Summary of Commerical Jet Airplane Accidents", Aug. 2015. Accessed on the Internet Oct. 12, 2017. URL: <https://web.archive.org/web/20150101000000*/http://www.boeing.com/resources/boeingdotcom/company/about_bca/pdf/statsum.pdf> (26 pages).

Aviation Performance Solutions, "What is Loss of Control In-flight (LOC-I)". Accessed on the Internet Oct. 12, 2017. URL:<http://apstraining.com/loss-of-control-in-flight-loc-i/> (8 pages).

* cited by examiner

METHOD AND ARCHITECTURE FOR CRITICAL SYSTEMS UTILIZING MULTI-CENTRIC ORTHOGONAL TOPOLOGY AND PERVASIVE RULES-DRIVEN DATA AND CONTROL ENCODING

CROSS-REFERENCE TO RELATED APPLICATIONS

The present application claims priority to Provisional Application No. 62/362,918, entitled Method and Architecture for Critical Systems Utilizing Multi-Centric Orthogonal Topology and Pervasive Rules-Driven Data and Control Encoding, filed on Jul. 15, 2016, the content of which is hereby incorporated by reference herein in its entirety.

FIELD OF THE INVENTION

The present disclosure relates to systems and methods for data processing. Particularly, the present disclosure relates to critical system architecture and encoding. More particularly, the present disclosure relates to a critical system architecture with an orthogonal topology, and a rules-driven data encoding method.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the explosive growth of critical data and operational systems, and the steady miniaturization of electronics, comes an increase in random errors and failures. While transistor count per chip is increasing, the reliability of transistors is, in many cases, declining. Integrated circuit technology with nano-scale features and power and energy constraints for the mobile device market are, at least in part, to blame. Near-threshold voltage operation within non-volatile memories trade off long-term reliability for reduced power. Storage technologies are also evolving at a rapid pace, but come with compromises such as limited write endurance and observable write errors. Important critical applications are being designed to run on mobile devices. These developments can introduce increased vulnerability and incidence of errors in operational systems. Likewise, applications that were not previously considered critical in nature may now run on commodity hardware and operate in environments that observe undesirable error or failure modes. Industries designing airliners, space vehicles, autonomous automobiles, and applications utilizing mobile technology require improved resiliency designs. Many systems of very large scale are also at risk.

Critical applications such as airliners, autonomous vehicles, space stations, power plants, and healthcare systems all depend on vast amounts of accurate data in order to function correctly. For example, airliners operate in problematic environments having fluctuating temperature and humidity, high shock and vibration, abnormal degradation of logic and memory circuits, electrical storms, radiation from space including naturally occurring ionizing particles or electromagnetic pulse, and the possibilities of fire, collision, and sabotage. Data centers, power plants, hospitals, financial offices, and the like can also experience earthquakes, storms, hurricanes, tsunamis, and other disasters. A reliable source of electrical power is an issue that affects critical systems in many ways.

A recent study by a leading airliner manufacturer found that between 2006 and 2015, 15 of 65 crashes were Loss of Control in Flight (LOC-I) and resulted in 1,396 deaths. Boeing, "Statistical Summary of Commercial Jet Airplane Accidents, 2015, available at http://www.boeing.com/resources/boeingdotcom/comp any/about_bca/pdf/statsum.pdf. Contemporary findings list LOC-I as being the highest cause of airliner fatalities, and missing or invalid data may be a significant cause. See Aviation Performance Solutions, "What is Loss of Control In-Flight (LOC-I)," http://apstraining.com/loss-of-control-in-flight-loc-i/. As the control systems evolve to handle takeoffs and landings, the experience level of pilots decreases. Today's more aggressive landing patterns designed to save time in the air put even more emphasis on the functionality and reliability of the autonomous controls. Complicating matters is a creeping demand to support more internet, mobile, and satellite access for passengers and crew. This presents additional security, data protection, and system issues and could require a separate parallel data and control system of similar architecture and methods.

In the healthcare industry, mobile devices such as tablets and phones have the connectivity and processing power to provide a mobile medical office via applications becoming available. Unfortunately, these mobile devices are often even more subject to errors than other electronics.

Thus, there is a need in the art for systems and methods for data processing. Particularly, there is a need in the art for critical system architecture and data protection for use in airliner systems, automobile systems, aerospace systems, healthcare systems, and other critical or large-scale systems.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one or more embodiments, relates to a system having two control centers communicably coupled over a network, at least one sub-network arranged orthogonal to the network, and an archive. The orthogonal sub-network may communicably couple each of the control centers to each of a sensor receiving sensed data and a controller controlling one or more operations based on the sensed data. The sensor and controller may be communicably coupled together over the orthogonal sub-network. In some embodiments, the archive may store a configuration table storing configuration data for each of the control centers, sensor, controller, and archive. In some embodiments, the archive may store a real-time time log of events storing actions performed by the control centers, sensor, controller, and archive. In some embodiments, each of the control centers may be communicably coupled to each other control center by two channels. The archive may include an array of storage devices. In some embodiments, the archive may be communicably coupled to the control enters over the network. In other embodiments, the archive may be communicably coupled to the control centers over the sub-network. The system may be arranged within an airliner and may be configured to operate the airliner. In other embodiments, the system may be arranged within an automobile and may be configured to operate the automobile. In an automobile, the controller may control a motor of the automobile. In still other embodiments, the system may be configured to provide access to healthcare data. In such embodiments, the sensor may be a personal medical device. Data transmitted within the system may be encoded, and the system may be configured to perform error correction or data recovery at each control center, sensor, controller, and archive. The error correction may correct for single and double bit errors per byte of data. In some embodiments, a same error correction code may be applied for both error correction and data recovery. Moreover, in some embodiments, the configuration table may store a preferred error correction code, format, and procedure for each component of the system, and the preferred error correction code, format, and procedure may be updated automatically based on recent errors or failures.

The present disclosure, in one or more embodiments, additionally relates to a method of error detection. The method may include receiving data, applying an error correction code to the data to obtain ECC data, and verifying the data by comparing the data to the ECC data. In some embodiments, the method may additionally include dividing the data into first and second portions and dividing the ECC data into first and second portions. The error correction code may use the generator polynomial $G_1(x)=1+x^3+x^4+x^5+x^8$ in some embodiments. In other embodiments, the error correction code may use the generator polynomial $G_2(x)=1+x+x^2+x^4+x^6+x^7+x^8$. In still other embodiments, the error correction code may use an extended Nordstrom-Robinson code. In still further embodiments, the error correction code may use a Hamming SECDED code. Other mathematical structures with similar capabilities may become apparent to those skilled in the art from the description of how the above error control codes are used within the disclosed embodiments.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

DETAILED DESCRIPTION

Figure 1:
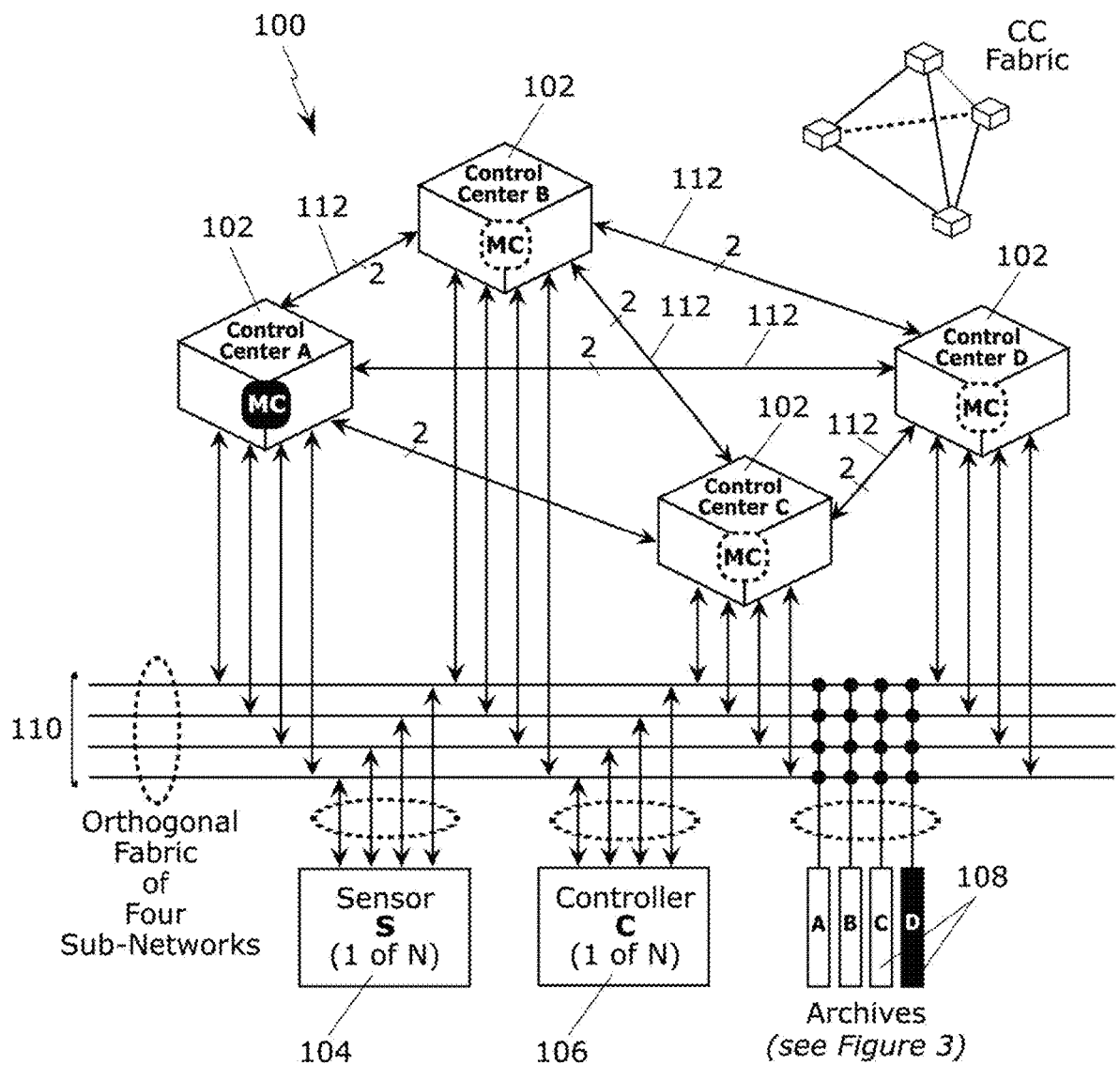
FIG. 1 is schematic diagram of a control system of the present disclosure, according to one or more embodiments.

The present disclosure relates to novel and advantageous systems and methods of processing and managing data in critical or large-scale systems, such as airliner, automobile, space station, power plant, and healthcare systems. Particularly, the present disclosure relates to a rules-driven data and control method mapped onto complementary physical architecture for a more reliable operational system. By maintaining an algebraic encoding of control and application data at fine granularities, whether static or in transit, it is possible to detect, isolate, and correct many errors that would otherwise go undetected. This more dynamic and precise method addresses cases where deteriorating conditions or cataclysmic events affect much of the system simultaneously, including the control system itself. As used herein, "control system" means the system, including its devices, networks, and other components.

In general, data encoded algebraically may be made more resilient to both spurious bit errors and catastrophic failures. Systems of the present disclosure provide redundancy whereby system components can fail, either sequentially or in multiples, with the system detecting, isolating, and rapidly reconfiguring itself with little or no interruption in quality of performance. The orthogonal topology presented in the present disclosure enables resiliency beyond what a conventional dual or triple fail-over design could achieve. Systems and methods of the present disclosure additionally include operational rules designed for maintaining encoded data ubiquitously within control systems. Error correction codes, data formats, and procedures provide improved levels of integrity and resiliency. Unique to systems and methods of the present disclosure, system data may be encoded for resiliency prior to the system being made operational. This may include the control system software, the operational software, application programs, and/or associated data. Encoding rules may be maintained during system operation.

Systems of the present disclosure may operate by maintaining both a configuration table and a time log of events. In some embodiments, every component in the control system may have a detailed entry in the configuration table. This may allow the control system to maintain a wide-ranging list of attributes and capabilities, including recovery methods and expected and realized error rates. Configuration table entries for multiple components may be comparatively rated. When error rate limits are reached or failures occur, the comparative ratings may be adjusted or dynamically reconfigured. This is important for a number of reasons, including for example normal maintenance analytics that schedule replacements. The control system may maintain a succession plan in case of failures requiring dynamic reconfigurations. The configuration table and time log of events may be maintained on persistent storage in archives that may be replicated as an array of arrays, leaving a history of the original data, any changes to the system configuration hardware or software, and a log of all sensor data and control functions including analytics.

Systems and methods of the present disclosure step away from conventional dual or triple failover systems to one of which all of the system components are interconnected into a network that is connected to a separate network of control system controllers. This may allow for system components to fail randomly without causing a fail-over scenario that may otherwise leave a significant fraction of the redundant components unavailable. However, systems of the present disclosure may be run in a pseudo fail-over mode, in some embodiments, whereby at least some redundant components could be powered off in a self-protect mode or in a circumstance where available power is limited, for example.

Network links of the present disclosure may be made relatively resilient with various error correction code (ECC) choices, formats, and procedures. In some embodiments, an initial ECC choice, format, and procedure may be preset for each component in the configuration table, for example. During error correction and recovery operations, a recovery algorithm may experiment with different methods of fault isolation and error recovery, and adjust a preferred method in the configuration table for one or more components. For example, a system of the present disclosure may find that different components could be erring or failing in different ways, and may learn to control each component according to its particular condition. Relatively robust error detection, error correction, and erasure recovery formats and procedures may be developed for the codes developed.

In systems and methods of the present disclosure, clear or original data (DATA) may be transferred separately from encoded data (ECC data). This may provide improved performance for large data objects, and may be more efficient for serial transfers. Once encoded, an ECC byte may become entangled algebraically with the corresponding DATA byte. This may provide considerable flexibility regarding how the two bytes get used either spatially or temporally. In some embodiments, modification to one of the bytes may necessitate modification to the other. Thus, data objects may become more stable and secure in that any tampering with one object may make it invalid per the other object. Byte level detection and isolation may be simplified. Moreover, this may leave data more difficult to steal or compromise. Additionally, data integrity may be enhanced by mirroring a data object with dual or triple algebraic copies, each using different generator equations. Industrial data protection products today often use non-algebraic triplicate mirroring. A figure of merit factor, Hd per data byte, was defined in order to illustrate the differences between conventional mirroring and algebraic mirroring. U.S. Pat. No. 7,103,824, titled "Multi-dimensional Data Protection and Mirroring Method for Micro Level Data," which is hereby incorporated by reference herein in its entirety, teaches that 8-bit binary data can be mirrored algebraically in a very similar manner as DNA letters are mirrored within the "double-helix." The patent shows too that stored data, data across channels, and data in transit can be made resilient to both spurious data errors and multiple channel catastrophic failures.

Encoding methods and algorithms of the present disclosure provide a balance between efficiency, simplicity, performance, and mathematical robustness. However, in some embodiments, systems requiring less critical reliability or requiring only specialized reliability, for example, can dial down the topology and methods to more effectively meet their cost requirements. Similarly, in some embodiments, the topology, codes, rules, and redundancy of the present systems and methods can be scaled to much greater levels.

Turning now to FIG. 1, a system 100 of the present disclosure is shown, according to one or more embodiments. In at least one embodiment, the system 100 may have four control centers 102 arranged in a tetrahedral topology, and providing four levels of redundancy. However, in other embodiments, the system 100 may have two, three, five, six, or any other suitable number of control centers 102 arranged in a suitable topology. For example, larger systems may operate within a three-dimensional torus network or other, more complex, topologies. It may be appreciated that in some embodiments, however, four levels or redundancy may provide a relatively reasonable cost and performance tradeoff for addressing sequential failures. The control center topology may utilize serial fiber-optic Ethernet, a radio frequency technology, or any other suitable network or combination of networks. In some embodiments, multiple network technologies may be used to avoid the possibility of all links susceptible to a common media related cause. The system 100 may additionally include one or more sensors 104, one or more controllers 106, and/or one or more archives 108. Each of the control centers 102, sensors 104, controllers 106, and archives 108 may be communicably coupled to an orthogonal fabric of sub-networks 110. In some embodiments, the system 100 may include an input/output capability to remote authority. For example, where the system 100, or a similar system, is arranged in an airliner, the system may include communication channels via satellite and ground based radio bands. These links may be made redundant and may connect to dispersed remote control centers.

Figure 2A:
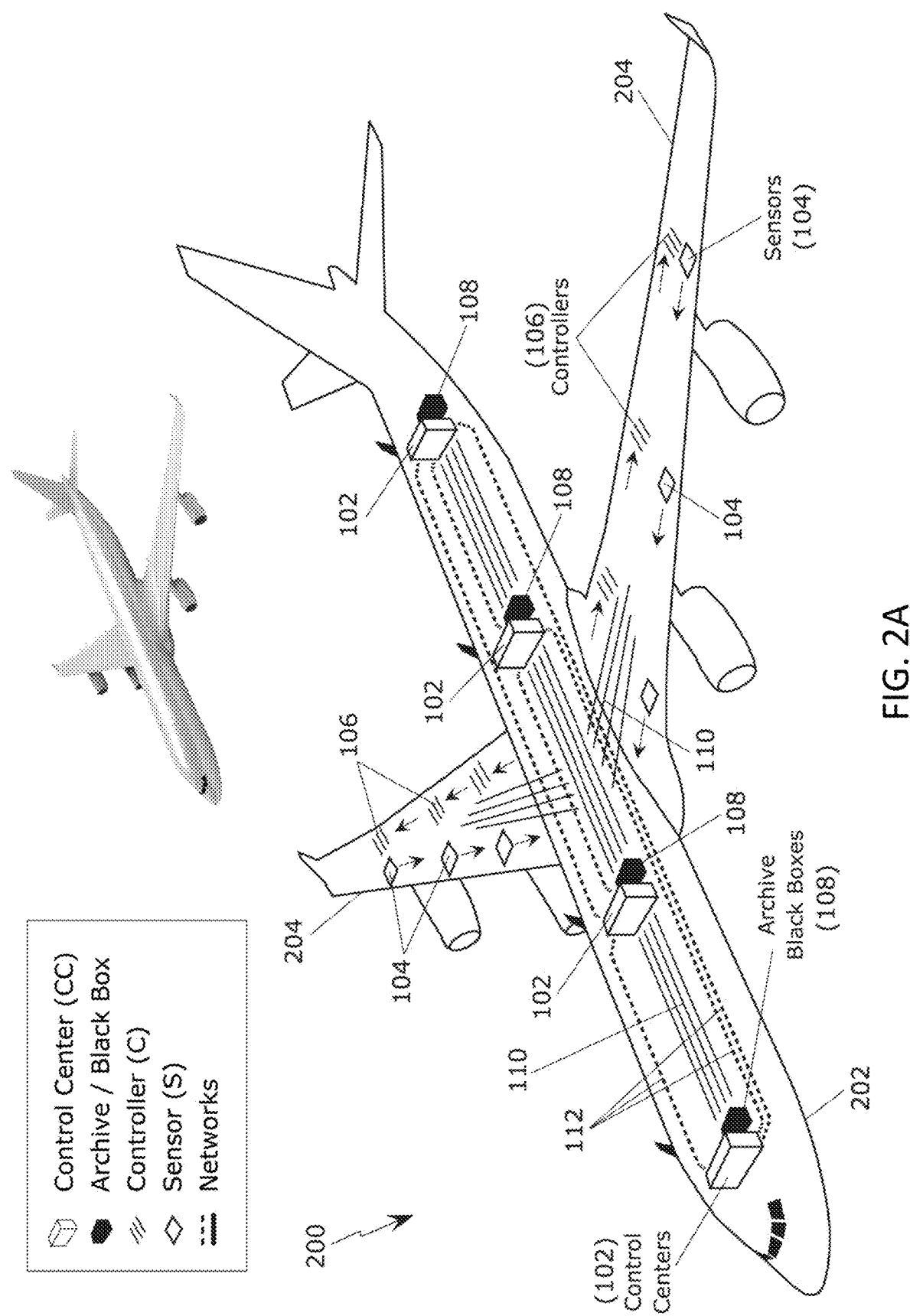
FIG. 2A is a schematic diagram of a system of the present disclosure arranged in and configured to operate an airliner, according to one or more embodiments.
Figure 2B:
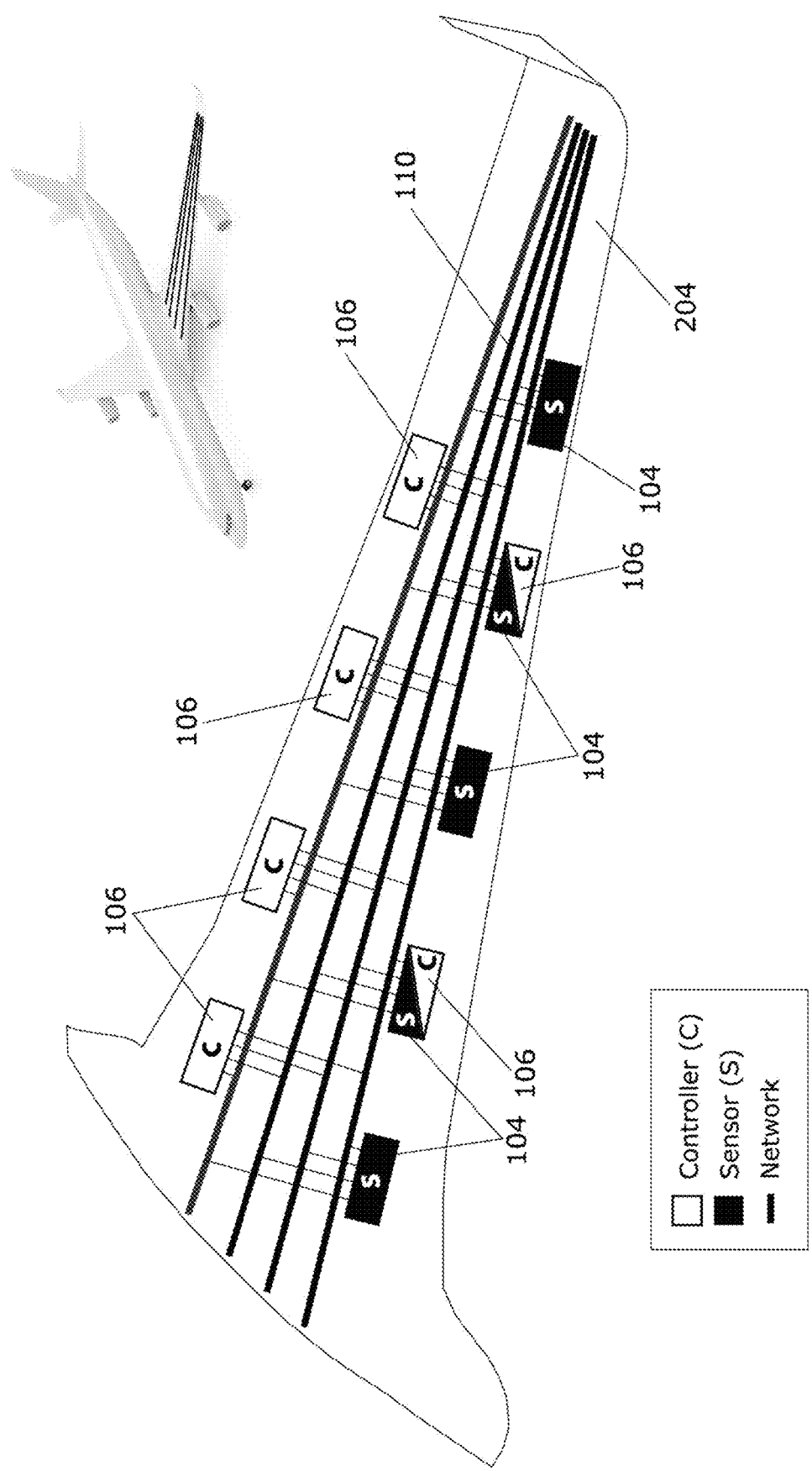
FIG. 2B is a schematic diagram of a portion of the system of FIG. 2A, as arranged in a wing of the airliner, according to one or more embodiments.
Figure 2C:
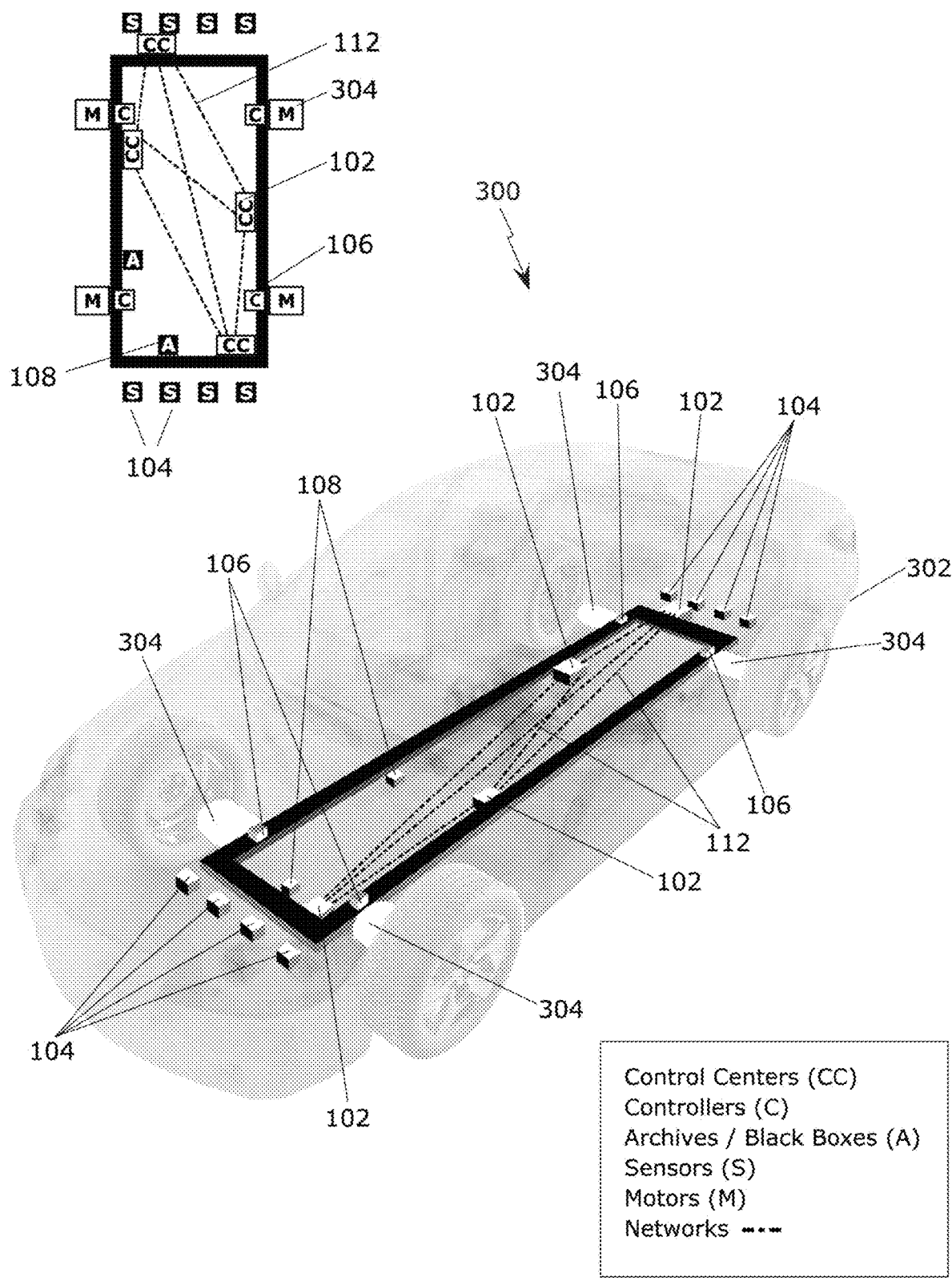
FIG. 2C is a schematic diagram of a system of the present disclosure arranged in and configured to operate an automobile, according to one or more embodiments.

In some embodiments, a system of the present disclosure may be used in the operation and performance of an airliner, such as a commercial airliner, for example. FIGS. 2A and 2B show one embodiment of a system 200 of the present disclosure arranged throughout the fuselage 202 and wings 204 of an airliner. With respect to an airliner system 200, the any pilot or crew members' equipment, such as a pilot's Electronic Flight Bag (EFB) or a modified commercial tablet or operational equivalent, may connect to the system and may have data encoded according to the methods described herein. In another embodiment, a system of the present disclosure may be used in the operation and performance of an automobile, such as an autonomous or partially autonomous automobile. FIG. 2C shows one embodiment of a system 300 of the present disclosure arranged throughout the body 302 of an automobile. In some embodiments, for example, a controller 106 may be configured to control a corresponding motor 304 or other device. For the automobile, the likelihood of a spurious error causing a driving error may be reduced, and if an accident does occurs, the system may be better prepared to continue to function properly, thus reducing the possibility of further improper actions.

Turning back to FIG. 1, each control center 102 may generally have hardware and/or software configured for controlling or more sensors 104, controllers 106, archives 108, and/or other components of the system 100. For example, a control center 102 may be configured to collect data from one or more sensors 104, analyze the data, store the data in one or more archives 108, and/or send commands to one or more controllers 106. In some embodiments, one or more control centers 102 may have an oversupply of processors or processor cores in case of failure(s). In some embodiments, each control center 102 may be configured to operate a portion of the system 100. In some embodiments, each control center 102 may be configured to operate the entire system 100, independently. For example, in some embodiments, one or more control centers 102 may be designated as a master controller. A master controller may nominally be the control center 102 responding to sensors and transmitting functions to controllers. Master controller code may be configured within each control center, and may provide for complete control of the system 100 as an entity and therefore as a fail-over capability. In some embodiments, the program code for master controller may run on dedicated processors or processor cores. In some embodiments, one control center 102 may be configured as an active master controller at a time. In other embodiments, multiple control centers 102 may run active master control center code, and may operate via, for example, majority vote or an algorithmic decision process. In some embodiments, it may be valuable to have all master controllers running in concert comparing control decisions and resolving decisions based on differences.

The control centers 102 of the system 100 may be connected to one another via one or more channels 112. In some embodiments, a pair of channels 112 may connect the control centers 102 to one another. The two channels 112 may provide a redundancy, or each may be used for different data. For example, one channel 112 may transfer DATA transfers, with the other channel transferring corresponding ECC data transfers. In general, any suitable number of channels 112 may be used between control centers 102 to provide a desired level of redundancy and/or bandwidth. In some embodiments, I/O latency of the channels 112 may be maintained at a relatively low level such that the control centers 102 may communicate efficiently to validate concurrency of sensory and control information.

As additionally shown in FIG. 1, the control centers 102 may each be communicably coupled to a fabric of networks, such as an orthogonal fabric of networks 110. In FIG. 1, four parallel sub-networks 110 are shown, but any suitable number of orthogonal networks or sub-networks may be incorporated. Each control center 102 may connect to each sub-network 110. In some embodiments, one or more sensors 104, one or more controllers 106, and/or one or more archives 108 may be communicably coupled to each of the parallel sub-networks 110. In some embodiments, switches and/or concentrators may be used as intermediate levels to connect the sensors 104, controllers 106, and/or archives 108. For example, a concentrator element may nominally connect to a single sub-network 110. In some embodiments, as for example with the system of FIG. 9 discussed below, the network topology and design may differ in order to achieve the desired orthogonal connectivity between control enters and driven devices.

Sensors 104 may generally be configured to collect or receive data. For example, a sensor 104 may be a thermometer, a pressure gauge, cockpit control, altimeter, air speed, ground speed, accelerator, radar input, g-force meter, mechanical position indicator, navigational input, hour meter, tachometer, compass, communication input, or any other suitable type of sensor.

Controllers 106 may generally be configured to perform various operations and commands within the system 100. Controllers 106 may be configured to receive commands or instructions from control centers 102. For example, controllers 106 may control such operations as digital engine control, wing and tail control, wing configuration, landing gear, cockpit feedback, radar, auxiliary electrical power, electrical distribution, air conditioning, navigational lights, communication systems, motor, and wheel braking.

In some embodiments, sensors 104 and controllers 106 may not have equivalent flexibility of location. Thus, networks and sub-networks 110 connecting them to the control centers 102 may be configured and placed in order to provide optimum reliability and resiliency. In some embodiments, each sensor 104 and each controller 106 may provide a number of inputs and outputs sufficient to communicate independently with each of the four or other number of sub-networks 110. For example, with respect to FIG. 1, each sensor 104 and controller 106 may provide four inputs and four outputs.

Figure 3:
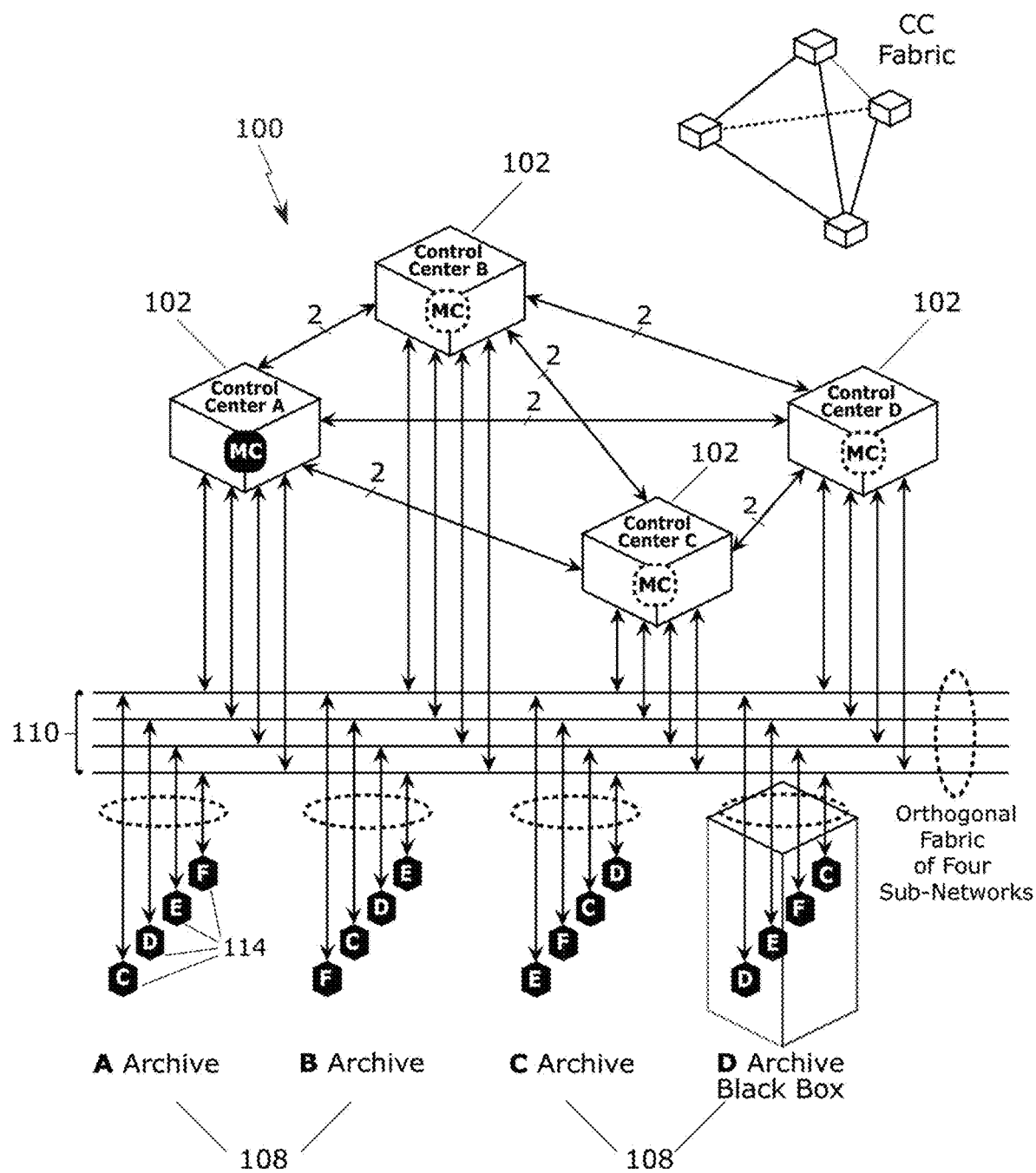
FIG. 3 is a schematic diagram of a control system of the present disclosure, according to one or more embodiments.

The system may have one or more archives 108 communicably coupled to the orthogonal sub-networks 110. The embodiment of FIG. 1 shows four archives 108, but any suitable number of archives may be used. In some embodiments, an archive 108 may be arranged proximate to, or may be embedded in, each control center 102, for example. In other embodiments, archives 108 may be remote or may be arranged in a different location within the system 100. The archives 108 may be dispersed such that they may be relatively resilient to both network and control center failures. FIG. 3 illustrates the four archives 108 of FIG. 1 in more detail with respect to the system 100. In some embodiments, each archive 108 may include an array of, for example four, storage devices 114 or arrays. The various storage devices 114 of an archive 108 may provide redundancy storage in some embodiments. Each archive 108 may generally store software and data for control center(s) 102, controller(s) 106, and/or sensor(s) 104. In some embodiments, an archive 108 may store control center 102 operating system program code, including master controller program code and libraries for real-time operating system (R-TOS) and applications, for example. In some embodiments, the archive 108 memory may be non-volatile, so that it may provide a boot-memory for the operating systems and a way to reload programs in case of a restart recovery. A switch to a redundant processor core would be an example. Data stored in the archives 108 may be in a format suitable for acquisition and analysis by maintenance and performance analytics. In some embodiments, each archive 108 may store and/or maintain a time log of events and/or a configuration table.

In some embodiments, each control center 102 may generate or help generate a running time log of events (TLOE) for sensory data and/or controller data processed and/or received by the system 100. The TLOE may generally record actions performed by system components. For example, the TLOE may record commands to controllers 106, status updates from sensors 104, errors and failures, reconfigurations, flight and voice data, and/or other time-stamped information. The TLOE may be stored in an archive 108.

The TLOE may be used for a variety of purposes, including operational control, providing an accurate timeline of events, graphing operational parameters for visual display, reporting platform status to remote personnel or manufacturers, and/or providing an archive. The TLOE may provide a real-time analysis with dynamic reselection. With respect to the airline system of FIG. 2A, for example, a cockpit voice recorder may be recorded synchronously with the TLOE to allow for accurate historical analysis of system functions and decisions together with pilot communication. In this way, an archive 108 may serve as a traditional "black box" recorder in some embodiments. In some embodiments, each archive 108 may maintain a TLOE of system data, and the TLOE data may be kept concurrent across all active archives and control centers 102. This may be particularly beneficial in the event of a failure of one or more control centers 102 or archives 108. In some embodiments, the system 100 may be configured to transmit TLOE data continuously, intermittently, periodically, upon request, or at any other suitable time. In some embodiments, the TLOE data may be transmitted in blocks or chunks. TLOE data may be filtered for particular analytics in some embodiments. For example, TLOE data may be filtered by time frame, location, type of event, such as errors, mechanical events, or electrical events, type of error, hardware failures, requests, retries, and/or other parameters.

A configuration table may store information for each control center 102, control center processor, core, network element, network concentrator, sensor 104, controller 106, archive 108, instrumentation display, remote connection, modular software object, and/or other system element. The configuration table may store a software library and application software library for the system 100. Entries for each element in the configuration table may include, but are not limited to, a name, location in the system 100, part number, model number, serial number, manufacturer, build date, software revision level, insertion date, power-on hours, power-on hour limit, capable operational modes, allowable error status, allowable error rates, current error rates, preferred ECC codes, preferred ECC procedures, rank in redundancy level, re-activation quality level, and/or other information. With the configuration table, the system 100 may dynamically prioritize redundant elements so as to maintain the highest performing elements active in the system. In some embodiments, components that share a redundancy position may be grouped accordingly in the configuration table and rated and sorted per qualities such as company of manufacture, error event history, and/or age in a configuration table. This may help to reduce maintenance time for the system in some embodiments. Moreover, the data in the configuration table may allow the system 100 to re-route through the network topology in case of broken links.

The archives 108, together, may provide redundant copies of all data in the system 100. For example, with four archives 108, there may be at least four redundant copies of the operating system and software libraries. With each archive 108 configured as an array of redundant arrays 114, there may be sixteen memories whereby any two complementary units may provide the total archive information. Or in some embodiments, the archives 108 could be stored via different ECC code polynomials. Anytime the system 100 makes a change to the operational configuration, it may be logged concurrently into all copies of the configuration table and TLOE. Various options could allow continuous, abbreviated, segmented or selected transmission of the TLOE and/or configuration table. Assuming redundant antenna, options to transmit in parallel may be available. Options to dump data during emergency situations would exist too.

The multi-centric control center topology of the systems of the present disclosure may provide redundant safe locations in order to withstand sequential control center 102 failures, and to provide alternative network views across the multi-dimensional topology. With multiple control centers 102, the system configuration can evolve multiple times before reaching a degraded operational level. Moreover, in some embodiments, the topology and control of the system 100 may allow for the system to be operated in a conventional four-level fail-over mode. In addition, the architecture of the systems 100, with configurable levels of redundancy, may permit multiple control centers and/or networks to be powered off in a self-protect mode and later brought back online after transiting lightning prone or other hazardous areas, for example. This may also help the system 100 withstand instances of limited, restricted, or failing electrical power, for example.

Additionally, a system of the present disclosure may support relatively extensive system monitoring with online and in-line diagnostics, comprehensive performance checking, and precise error logging. The system may help to bring up the platform during the manufacturing phase where there may be an abundance of less than perfect parts. In some embodiments, the system may be used as a manufacturing bring-up system to stress test and isolate errors and failures, logging and reporting system integrity performance, with a TLOE and configuration table maintained in an archive. In another embodiment, the system may be incorporated into a simulation system for use in development testing and design testing prior to prototype testing, with up to 100 percent carryover of effort.

A system, such as that described above with respect to FIG. 1, may operate to self-detect, isolate, and correct errors and failures. In particular, systems of the present disclosure may be configured to perform a rules-driven method of data collection and processing, which may provide for encoding data wherever used, transmitted, or stored, such that raw data is continually protected within the system. In general, the system may operate to encode data as soon as, or very shortly after, it is collected or received, and to maintain the encoding until the data is discarded. This may include sensor data, controller data, processor program code, processor generated data, application data, data in storage as logs, remote transmissions, archives, black box recordings, and/or other types of data within the system. A rules-driven approach may provide for greater standardization, uniformity, and completeness of design. As described below, it may be appreciated that a miniature error control code may pervasively safeguard every byte of data in the complex system.

Figure 4:
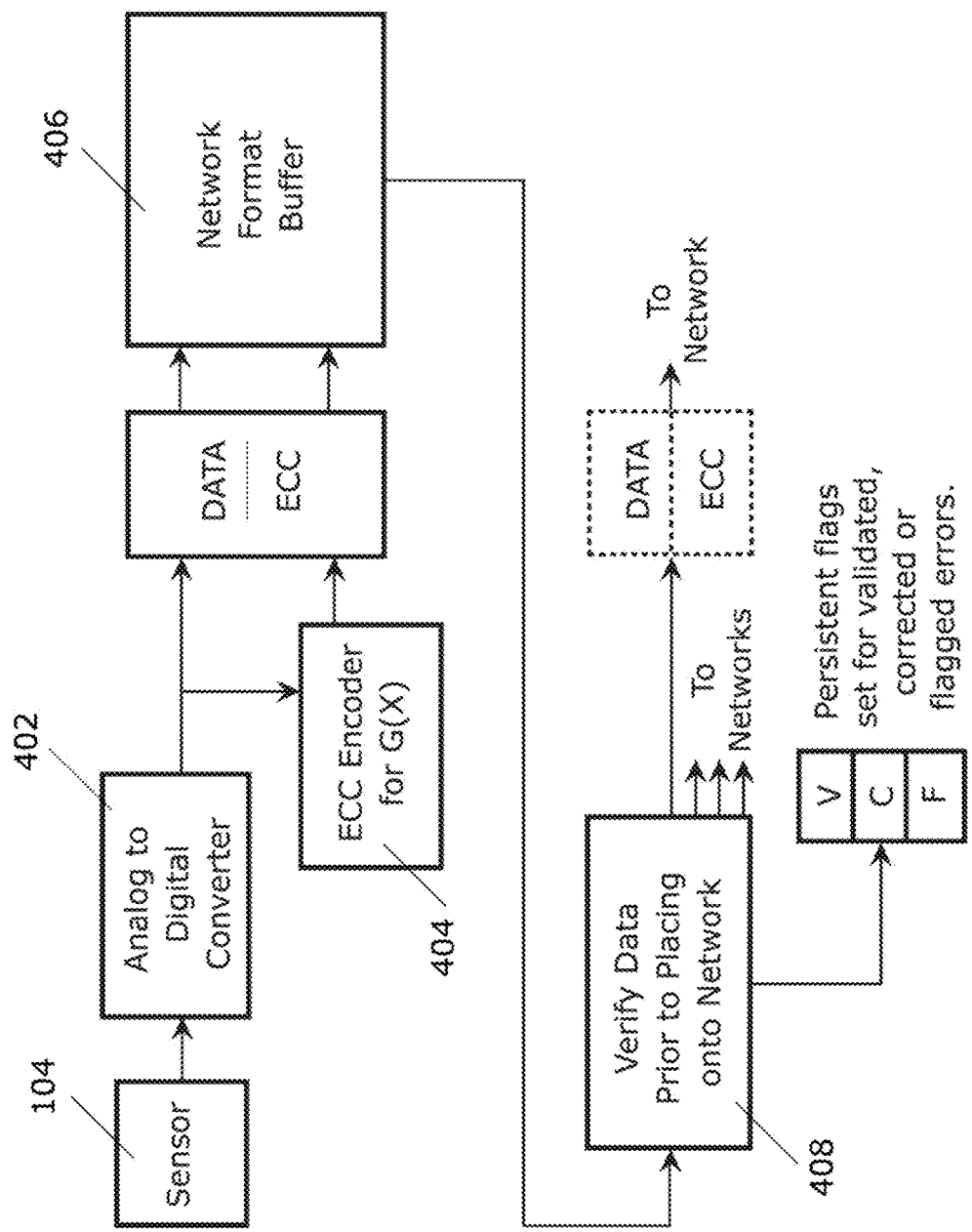
FIG. 4 is a flow diagram of data received at a sensor, according to one or more embodiments.

FIG. 4 shows one embodiment of a flow diagram for data received at a sensor 104 of the system. As described above, the sensor 104 may be a thermometer or pressure gauge, for example. The sensor 104 may receive sensor data, such as a temperature or pressure reading. The system may then convert the received sensor data from analog to digital via a converter circuit 402. An algebraic error correction code (ECC) encoder 404 may encode the data into ECC data. Both the original DATA and the ECC data may be sent to a network format buffer 406 in some embodiments, and may be verified 408, such a algebraically or via a lookup table, prior to being sent to the parallel sub-networks. By having the algebraic ECC with the original DATA, data validation, error detection, and correction may be an option at the network entrance and beyond. Upon verification, the data may receive one or more flags for validated, corrected, or flagged errors. That is, if the data is validated as correct, it may receive a corresponding flag. If the data is determined to have an error, it may receive a corresponding flag. If the data is determined to have an error that is corrected, it may receive a corresponding flag. The DATA and ECC data may then be sent to the sub-networks 110.

Figure 5:
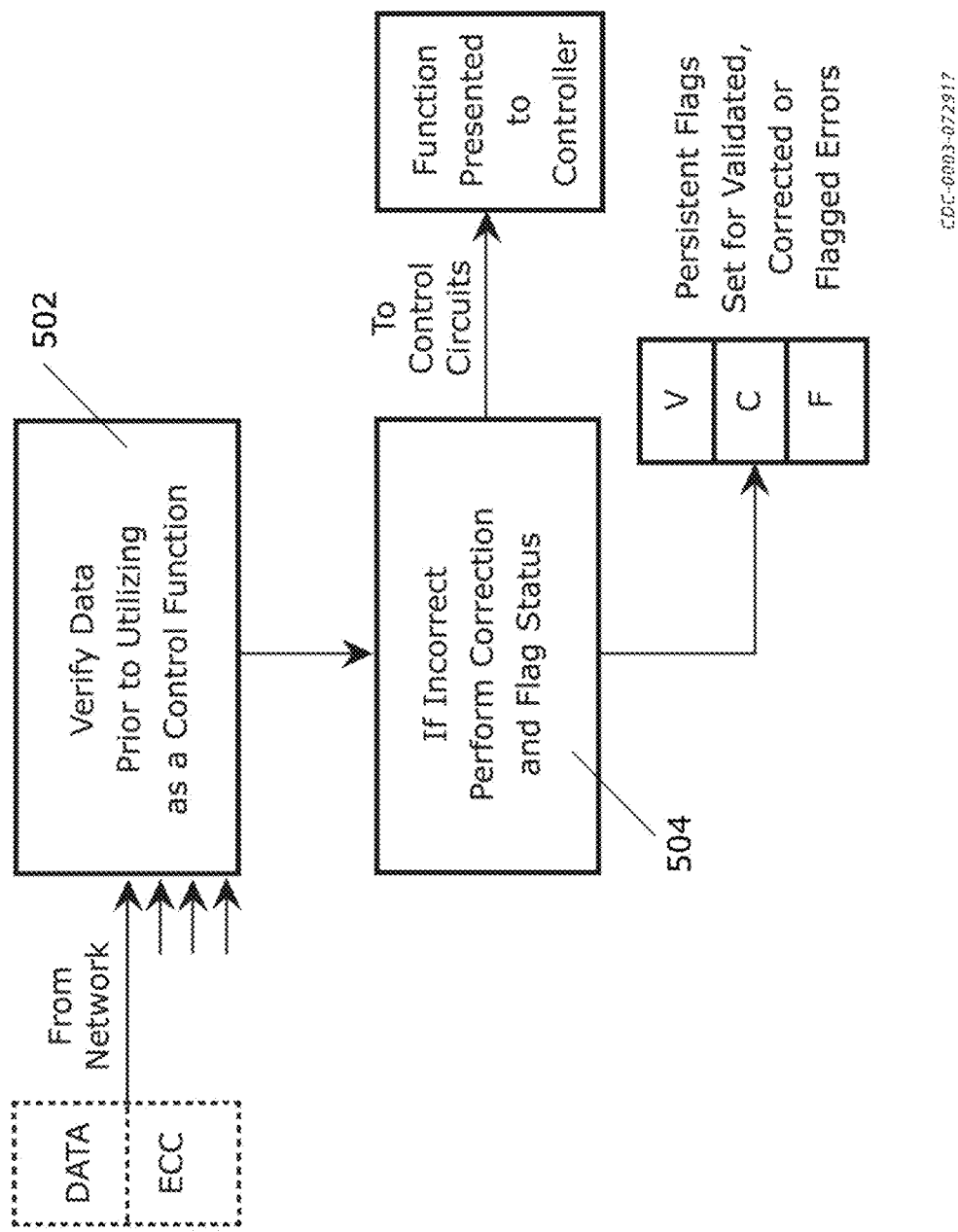
FIG. 5 is a flow diagram of data sent to a controller, according to one or more embodiments.

Turning now to FIG. 5, a data flow diagram of outputting control function data to a controller is provided, according to one or more embodiments. For example, a control center may verify DATA and ECC data 502 prior to sending it as a command or function to a controller. The DATA and ECC may be verified by comparing the DATA and ECC via equations or a lookup table to determine if they match or correspond accurately. If the DATA and ECC do not accurately correspond, or the data is otherwise incorrect, the control center my assign a corresponding flag to the data or to a portion of the data 504. Moreover, if the data is validated, it may receive a corresponding flag. Upon verification, the control center may transmit the DATA and ECC of the control function data to the appropriate controller over the orthogonal network to perform the particular control function.

Figure 6:
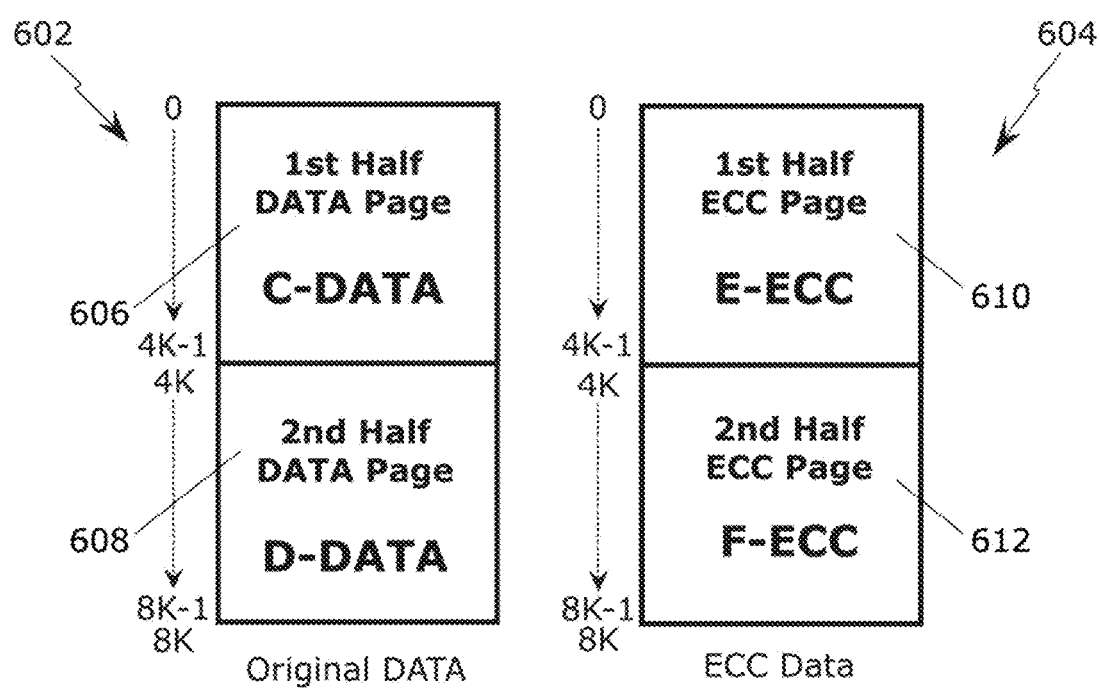
FIG. 6 is a schematic diagram of original data and algebraic data, according to one or more embodiments.

FIG. 6 shows an example of original DATA 602 and algebraic ECC data 604, according to one or more embodiments. In some embodiments, a data page may be divided into two half pages. In other embodiments, a data page may be divided into any suitable number of data pages. For example, the system may identify a first half of a DATA page as C-DATA 606, and may identify a second half of the DATA page as D-DATA 608. ECC data pages may similarly be divided into two or more portions. For example, a first portion of the ECC data may be identified as E-ECC data 610, and a second portion may be identified as F-ECC data 612. Each of E-ECC 610 and F-ECC 612 may include portions of both C-DATA 606 and D-DATA 608 in some embodiments. The two DATA half pages 606, 608 and two ECC half pages 610, 612 may be stored and/or transmitted in parallel or series on single or multiple devices or channels, while providing dual failure resiliency attributes and error correction capabilities. For example, data may be organized into 8-kilobyte pages. Encoded DATA may thus have two, 4-kilobyte half pages and two, 4-kilobyte ECC half pages in some embodiments. In other embodiments, the data pages and divided half pages or portions may have any other suitable size. If the half pages are distributed across four devices, then up to any two devices can fail, and the remaining two can be translated back to original data. In other embodiments, data may be transmitted serially: C, D, E, and F. If data adheres to object oriented structure, the DATA and ECC may be divided into first and second half object lengths, for example.

A variety of different encoding algorithms and/or formats may be used to generate ECC data. In general, the original DATA may remain undisturbed for encoding and/or transferring, while the algebraic copy (ECC) fields may be encoded and/or formatted. Encoding algorithms may be used to translate the data into code words. In some embodiments, an example ECC polynomial may be $G_1(x)=1+x^3+x^4+x^5+x^8$. A resulting code word may then be $[CW_i]=[D_i][E_i]=d^0d^1d^2d^3d^4d^5d^6d^7\ e^0e^1e^2e^3e^4e^5e^6e^7$. The code word in binary array form may be:

$$[D_i] \quad d^0d^1d^2d^3 \quad s\{\text{hexadecimal row dispersal}\}$$

$$d^4d^5d^6d^7 \quad t$$

$$[E_i] \quad e^0e^1e^2e^3 \quad u$$

$$e^4e^5e^6e^7 \quad v$$

$$\ldots$$

$$wxyz \quad \{\text{hexadecimal column dispersal}\}$$

The following table provides an example of code words for software lookup using row dispersion. Similar tables may be provided for the column dispersion method and for other generator polynomials and formulas.

| | | | | | | | | | | | | | | | |
|---|---|---|---|---|---|---|---|---|---|---|---|---|---|---|---|
| | | | | | | | CDC-0013-061917 | | | | | | | | |
| DA-TA | CODE WORD stuv | DA-TA | CODE WORD stuv | DA-TA | CODE WORD stuv | DA-TA | CODE WORD stuv | DA-TA | CODE WORD stuv | DA-TA | CODE WORD stuv | DA-TA | CODE WORD stuv | DA-TA | CODE WORD stuv |
| 00 | 0000 | 01 | 1093 | 02 | 2027 | 03 | 30B4 | 04 | 404E | 05 | 50DD | 06 | 6069 | 07 | 70FA |
| 08 | 801F | 09 | 908C | 0A | A038 | 0B | B0AB | 0C | C051 | 0D | D0C2 | 0E | E076 | 0F | F0E5 |
| 10 | 01BD | 11 | 112E | 12 | 219A | 13 | 3109 | 14 | 41F3 | 15 | 5160 | 16 | 61D4 | 17 | 7147 |
| 18 | 81A2 | 19 | 9131 | 1A | A185 | 1B | B116 | 1C | C1EC | 1D | D17F | 1E | E1CB | 1F | F158 |
| 20 | 02F8 | 21 | 126B | 22 | 22DF | 23 | 324C | 24 | 42B6 | 25 | 5225 | 26 | 6291 | 27 | 7202 |
| 28 | 82E7 | 29 | 9274 | 2A | A2C0 | 2B | B253 | 2C | C2A9 | 2D | D23A | 2E | E28E | 2F | F21D |
| 30 | 0345 | 31 | 13D6 | 32 | 2362 | 33 | 33F1 | 34 | 430B | 35 | 5398 | 36 | 632C | 37 | 73BF |
| 38 | 835A | 39 | 93C9 | 3A | A37D | 3B | B3EE | 3C | C314 | 3D | D387 | 3E | E333 | 3F | F3A0 |
| 40 | 0472 | 41 | 14E1 | 42 | 2455 | 43 | 34C6 | 44 | 443C | 45 | 54AF | 46 | 641B | 47 | 7488 |
| 48 | 846D | 49 | 94FE | 4A | A44A | 4B | B4D9 | 4C | C423 | 4D | D4B0 | 4E | E404 | 4F | F497 |
| 50 | 05CF | 51 | 155C | 52 | 25E8 | 53 | 357B | 54 | 4581 | 55 | 5512 | 56 | 65A6 | 57 | 7535 |
| 58 | 85D0 | 59 | 9543 | 5A | A5F7 | 5B | B564 | 5C | C59E | 5D | D50D | 5E | E5B9 | 5F | F52A |
| 60 | 068A | 61 | 1619 | 62 | 26AD | 63 | 363E | 64 | 46C4 | 65 | 5657 | 66 | 66E3 | 67 | 7670 |
| 68 | 8695 | 69 | 9606 | 6A | A6B2 | 6B | B621 | 6C | C6DB | 6D | D648 | 6E | E6FC | 6F | F66F |
| 70 | 0737 | 71 | 17A4 | 72 | 2710 | 73 | 3783 | 74 | 4779 | 75 | 57EA | 76 | 675E | 77 | 77CD |
| 78 | 8728 | 79 | 97BB | 7A | A70F | 7B | B79C | 7C | C766 | 7D | D7F5 | 7E | E741 | 7F | F7D2 |
| 80 | 08E4 | 81 | 1877 | 82 | 28C3 | 83 | 3850 | 84 | 48AA | 85 | 5839 | 86 | 688D | 87 | 781E |
| 88 | 88FB | 89 | 9868 | 8A | A8DC | 8B | B84F | 8C | C8B5 | 8D | D826 | 8E | E892 | 8F | F801 |
| 90 | 0959 | 91 | 19CA | 92 | 297E | 93 | 39ED | 94 | 4917 | 95 | 5984 | 96 | 6930 | 97 | 79A3 |
| 98 | 8946 | 99 | 99D5 | 9A | A961 | 9B | B9F2 | 9C | C908 | 9D | D99B | 9E | E92F | 9F | F9BC |
| A0 | 0A1C | A1 | 1A8F | A2 | 2A3B | A3 | 3AA8 | A4 | 4A52 | A5 | 5AC1 | A6 | 6A75 | A7 | 7AE6 |
| A8 | 8403 | A9 | 9A90 | AA | AA24 | AB | BAB7 | AC | CA4D | AD | DADE | AE | EA6A | AF | FAF9 |
| B0 | 0BA1 | B1 | 1B32 | B2 | 2B86 | B3 | 3B15 | B4 | 4BEF | B5 | 5B7C | B6 | 6BC8 | B7 | 7B5B |
| B8 | 8BBE | B9 | 9B2D | BA | AB99 | BB | BB0A | BC | CBF0 | BD | DB63 | BE | EBD7 | BF | FB44 |
| C0 | 0C96 | C1 | 1C05 | C2 | 2CB1 | C3 | 3C22 | C4 | 4CD8 | C5 | 5C4B | C6 | 6CFF | C7 | 7C6C |
| C8 | 8C89 | C9 | 9C1A | CA | ACAE | CB | BC3D | CC | CCC7 | CD | DC54 | CE | ECE0 | CF | FC73 |
| D0 | 0D2B | D1 | 1DB8 | D2 | 2D0C | D3 | 3D9F | D4 | 4D65 | D5 | 5DF6 | D6 | 6D42 | D7 | 7DD1 |
| D8 | 8D34 | D9 | 9DA7 | DA | AD13 | DB | BD80 | DC | CD7A | DD | DDE9 | DE | ED5D | DF | FDCE |
| E0 | 0E6E | E1 | 1EFD | E2 | 2E49 | E3 | 3EDA | E4 | 4E20 | E5 | 5EB3 | E6 | 6E07 | E7 | 7E94 |
| E8 | 8E71 | E9 | 9EE2 | EA | AE56 | EB | BEC5 | EC | CE3F | ED | DEAC | EE | EE18 | EF | FE8B |

-continued

CDC-0013-061917

| DATA | CODE WORD stuv | DATA | CODE WORD stuv | DATA | CODE WORD stuv | DATA | CODE WORD stuv | DATA | CODE WORD stuv | DATA | CODE WORD stuv | DATA | CODE WORD stuv | DATA | CODE WORD stuv |
|---|---|---|---|---|---|---|---|---|---|---|---|---|---|---|---|
| F0 | 0FD3 | F1 | 1F40 | F2 | 2FF4 | F3 | 3F67 | F4 | 4F9D | F5 | 5F0E | F6 | 6FBA | F7 | 7F29 |
| F8 | 8FCC | F9 | 9F5F | FA | AFEB | FB | BF78 | FC | CF82 | FD | DF11 | FE | EFA5 | FF | FF36 |

Some examples of encoding algorithms are provided below.

Denote the $1^{st}$ DATA half-page as C-Data.

$$C^7 C^6 C^5 C^4 * C^3 C^2 C^1 C^0$$

$$C^7 C^6 C^5 C^4 * C^3 C^2 C^1 C^0$$

$$C^7 C^6 C^5 C^4 * C^3 C^2 C^1 C^0$$

$$*$$

$$C^7 C^6 C^5 C^4 * C^3 C^2 C^1 C^0$$

Denote the $2^{nd}$ DATA half-page as D-Data.

$$D^7 D^6 D^5 D^4 * D^3 D^2 D^1 D^0$$

$$D^7 D^6 D^5 D^4 * D^3 D^2 D^1 D^0$$

$$D^7 D^6 D^5 D^4 * D^3 D^2 D^1 D^0$$

$$*$$

$$D^7 D^6 D^5 D^4 * D^3 D^2 D^1 D^0$$

Denote the $1^{st}$ ECC half-page as E-Data.

$$E^7 E^6 E^5 E^4 * E^3 E^2 E^1 E^0$$

$$E^7 E^6 E^5 E^4 * E^3 E^2 E^1 E^0$$

$$E^7 E^6 E^5 E^4 * E^3 E^2 E^1 E^0$$

$$*$$

$$E^7 E^6 E^5 E^4 * E^3 E^2 E^1 E^0$$

Denote the $2^{nd}$ ECC half-page as F-Data.

$$F^7 F^6 F^5 F^4 * F^3 F^2 F^1 F^0$$

$$F^7 F^6 F^5 F^4 * F^3 F^2 F^1 F^0$$

$$F^7 F^6 F^5 F^4 * F^3 F^2 F^1 F^0$$

$$*$$

$$F^7 F^6 F^5 F^4 * F^3 F^2 F^1 F^0$$

Double-byte translation equations based on $G_1(X)$.

$$E^0 = C^0 + C^3 + D^0 + D^1 + D^2 \quad C^0 = E^2 + E^3 + F^0 + F^1$$
$$E^1 = C^1 + D^0 + D^1 + D^2 + D^3 \quad C^1 = E^0 + E^3 + F^0 + F^1 + F^2$$
$$E^2 = C^2 + D^1 + D^2 + D^3 \quad C^2 = E^1 + F^0 + F^1 + F^2 + F^3$$
$$E^3 = C^0 + D^0 + D^1 + D^3 \quad C^3 = E^3 + F^0 + F^2 + F^3$$
$$E^4 = C^4 + C^7 + D^4 + D^5 + D^6 \quad C^4 = E^6 + E^7 + F^4 + F^5$$
$$E^5 = C^5 + D^4 + D^5 + D^6 + D^7 \quad C^5 = E^4 + E^7 + F^4 + F^5 + F^6$$
$$E^6 = C^6 + D^5 + D^6 + D^7 \quad C^6 = E^5 + F^4 + F^5 + F^6 + F^7$$
$$E^7 = C^4 + D^4 + D^5 + D^7 \quad C^7 = E^7 + F^4 + F^6 + F^7$$

$$F^0 = C^0 + C^1 + C^3 + D^0 \quad D^0 = E^0 + E^2 + E^3 + F^3$$
$$F^1 = C^0 + C^1 + C^2 + C^3 + D^2 \quad D^1 = E^0 + E^1 + E^2 + F^1$$
$$F^2 = C^1 + C^2 + C^3 + D^0 + D^3 \quad D^2 = E^0 + E^1 + E^2 + E^3 + F^2$$
$$F^3 = C^2 + C^3 + D^0 + D^1 \quad D^3 = E^1 + E^2 + E^3 + F^0 + F^3$$
$$F^4 = C^4 + C^5 + C^7 + D^4 \quad D^4 = E^4 + E^6 + E^7 + F^7$$
$$F^5 = C^4 + C^5 + C^6 + C^7 + D^6 \quad D^5 = E^4 + E^5 + E^6 + F^5$$
$$F^6 = C^5 + C^6 + C^7 + D^4 + D^7 \quad D^6 = E^4 + E^5 + E^6 + E^7 + F^6$$
$$F^7 = C^6 + C^7 + D^4 + D^5 \quad D^7 = E^5 + E^6 + E^7 + F^4 + F^7$$

Given D-Data and E-Data, evaluate C-Data (*F-Data can be decoded as well).

$$C^0 = C^0 + D^1 + D^3 + E^3$$

$$C^1 = D^0 + D^1 + D^2 + D^3 + E^1$$

$$C^2 = D^1 + D^2 + D^3 + E^2$$

$$C^3 = D^2 + D^3 + E^0 + E^3$$

$$C^4 = D^4 + D^5 + D^7 + E^7$$

$$C^5 = D^4 + D^5 + D^6 + D^7 + E^5$$

$$C^6 = D^5 + D^6 + D^7 + E^6$$

$$C^7 = D^6 + D^7 + E^4 + E^7$$

Given D-Data and F-Data, evaluate C-Data.

$$C^0 = D^0 + D^2 + D^3 + F^1 + F^2$$

$$C^1 = D^1 + D^3 + F^2 + F^3$$

$$C^2 = D^0 + D^2 + F^0 + F^1$$

$$C^3 = D^1 + D^2 + F^0 + F^1 + F^3$$

$$C^4 = D^4 + D^6 + D^7 + F^5 + F^6$$

$$C^5 = D^5 + D^7 + F^6 + F^7$$

$$C^6 = D^4 + D^6 + F^4 + F^5$$

$$C^7 = D^5 + D^6 + F^4 + F^5 + F^7$$

Given C-Data and E-Data, evaluate D-Data.

$$D^0 = C^1 + C^2 + E^1 + E^2$$

$$D^1 = C^2 + C^3 + E^0 + E^2 + E^3$$

$$D^2 = C^0 + C^1 + E^1 + E^3$$

$$D^3 = C^0 + C^1 + C^3 + E^0 + E^1$$

$$D^4 = C^5 + C^6 + E^5 + E^6$$

$$D^5 = C^6 + C^7 + E^4 + E^6 + E^7$$

$$D^6 = C^4 + C^5 + E^5 + E^7$$

$$D^7 = C^4 + C^5 + C^7 + E^4 + E^5$$

Given C-Data and F-Data, evaluate D-Data.

$$D^0 = C^0 + C^1 + C^3 + F^0$$

$$D^1 = C^0 + C^1 + C^2 + F^0 + F^3$$

$$D^2 = C^0 + C^1 + C^2 + C^3 + F^1$$

$$D^3 = C^0 + C^2 + F^0 + F^2$$

$$D^4 = C^4 + C^5 + C^7 + F^4$$

$$D^5 = C^4 + C^5 + C^6 + F^4 + F^7$$

$$D^6 = C^4 + C^5 + C^6 + C^7 + F^5$$

$$D^7 = C^4 + C^6 + F^4 + F^6$$

Encoding may begin with the first eight bits of C and D data, producing E and F data. Similar equations may be used for wider words by solving 16, 32, or 64 equations for 16, 32, or 64 unknowns, for example. In other embodiments, equations for other data widths may be used. In general, the encoding for each 8-bit segment or larger word widths may be replicated and the same instructions translating all the segments in parallel may be executed. In some embodiments, the segments may be compiled to execute in vector or SIMD units, for example. The above equations, or similar equations, may be applied spatially or temporally in some embodiments. In the case of a memory move, where data paths may be wide, a spatial format may be a better option in some embodiments. If the transfer is over serial fiber or R.F., however, a temporal format may be a better option, in which four serial segments could be apart in time from each other. A mixed mode may be two back-to-back serial DATA transfers on one serial channel and two back-to-back serial ECC transfers on a second serial channel. If any two segments are received, erasure recovery may be applied. Once all segments are received, both error correction and erasure recovery may be applied.

In some embodiments, the first half or portion of the data may be directed to a first device, time slot, or channel, and the second half or portion of the data may be directed to a second device, time lot, or channel. The encoding methods of the present disclosure may provide granularity of error detection and correction to a mere 4-bits within the dispersion fields, which may be statistically advantageous. Looking, for example, to the system 100 shown in FIG. 1, where dual channels 112 are arranged between each control center 102, a first channel may transmit clear data objects (DATA) while a second channel transmits the algebraic copies (ECC), for example. The two objects may be stored at different memory locations to facilitate the process and add redundancy and resiliency and maintain performance.

In addition, embodiments of the present disclosure may use any of the following four root encoding algorithms or others with varying attributes. Besides error detection and recovery, these algorithms may provide other advantages for generating encryptions and hash values according to their mathematical attributes. Each set of encoding equations may have a corresponding set of decoding equations. Generally, the encoding and decoding methods described herein may be executed in parallel in some embodiments, and/or may be executed by vector processors, SIMD units, or graphical engines, for example.

$G_0(X)$ is ordinary binary mirroring $$e^0 = d^0$$

$$e^1 = d^1$$

$$e^2 = d^2$$

$$e^3 = d^3$$

$$e^4 = d^4$$

$$e^5 = d^5$$

$$e^6 = d^6$$

$$e^7 = d^7$$

$G_1(X)$ is a factor of the cyclotomic polynomial $X^{17}-1$.

The generator function for these equations is $G_1(X) = 1 + x^3 + x^4 + x^5 + x^8$.

$$e^0 = d^0 + d^3 + d^4 + d^5 + d^6$$

$$e^1 = d^1 + d^4 + d^5 + d^6 + d^7$$

$$e^2 = d^2 + d^5 + d^6 + d^7$$

$$e^3 = d^0 + d^4 + d^5 + d^7$$

$$e^4 = d^0 + d^1 + d^3 + d^4$$

$$e^5 = d^0 + d^1 + d^2 + d^3 + d^6$$

$$e^6 = d^1 + d^2 + d^3 + d^4 + d^7$$

$$e^7 = d^2 + d^3 + d^4 + d^5$$

$$d^0 = e^2 + e^3 + e^4 + e^5$$

$$d^1 = e^0 + e^3 + e^4 + e^5 + e^6$$

$$d^2 = e^1 + e^4 + e^5 + e^6 + e^7$$

$$d^3 = e^3 + e^4 + e^6 + e^7$$

$$d^4 = e^0 + e^2 + e^3 + e^7$$

$$d^5 = e^0 + e^1 + e^2 + e^5$$

$$d^6 = e^0 + e^1 + e^2 + e^3 + e^6$$

$$d^7 = e^1 + e^2 + e^3 + e^4 + e^7$$

$G_2(X)$ is also a factor of the cyclotomic polynomial $X^{17}-1$.

The generator function for these equations is $G_2(X)=1+x+x^2+x^4+x^6+x^7+x^8$.

$$e^0 = d^0 + d^1 + d^3 + d^6$$
$$e^1 = d^0 + d^2 + d^3 + d^4 + d^6 + d^7$$
$$e^2 = d^0 + d^4 + d^5 + d^6 + d^7$$
$$e^3 = d^1 + d^5 + d^6 + d^7$$
$$e^4 = d^0 + d^1 + d^2 + d^3 + d^7$$
$$e^5 = d^1 + d^2 + d^3 + d^4$$
$$e^6 = d^0 + d^1 + d^2 + d^4 + d^5 + d^6$$
$$e^7 = d^0 + d^2 + d^5 + d^7$$

$$d^0 = e^0 + e^2 + e^5 + e^7$$
$$d^1 = e^1 + e^2 + e^3 + e^5 + e^6 + e^7$$
$$d^2 = e^3 + e^4 + e^5 + e^6$$
$$d^3 = e^0 + e^4 + e^5 + e^6 + e^7$$
$$d^4 = e^0 + e^1 + e^2 + e^6$$
$$d^5 = e^0 + e^1 + e^2 + e^3 + e^7$$
$$d^6 = e^0 + e^1 + e^3 + e^4 + e^5 + e^7$$
$$d^7 = e^1 + e^4 + e^6 + e^7$$

$G_3(X)$ is an extended Nordstrom-Robinson code, a non-linear code.

$$e^0 = d^7 + d^6 + d^0 + d^1 + d^3 + (d^0 + d^4)(d^1 + d^2 + d^3 + d^5) + (d^1 + d^2)(d^3 + d^5)$$

$$e^1 = d^7 + d^0 + d^1 + d^2 + d^4 + (d^1 + d^5)(d^2 + d^3 + d^4 + d^6) + (d^2 + d^3)(d^4 + d^6)$$

$$e^2 = d^7 + d^1 + d^2 + d^3 + d^5 + (d^2 + d^6)(d^3 + d^4 + d^5 + d^0) + (d^3 + d^4)(d^5 + d^0)$$

$$e^3 = d^7 + d^2 + d^3 + d^4 + d^6 + (d^3 + d^0)(d^4 + d^5 + d^6 + d^1) + (d^4 + d^5)(d^6 + d^1)$$

$$e^4 = d^7 + d^3 + d^4 + d^5 + d^0 + (d^4 + d^1)(d^5 + d^6 + d^0 + d^2) + (d^5 + d^6)(d^0 + d^2)$$

$$e^5 = d^7 + d^4 + d^5 + d^6 + d^1 + (d^5 + d^2)(d^6 + d^0 + d^1 + d^3) + (d^6 + d^0)(d^1 + d^3)$$

$$e^6 = d^7 + d^5 + d^6 + d^0 + d^2 + (d^6 + d^3)(d^0 + d^1 + d^2 + d^4) + (d^0 + d^1)(d^2 + d^4)$$

$$e^7 = d^0 + d^2 + d^3 + d^4 + d^5 + d^6 + d^7 + e^0 + e^1 + e^2 + e^3 + e^4 + e^5 + e^6$$

Given the ECC byte, the DATA byte can be evaluated using the following equations:

$$d^0 = e^7 + e^1 + e^2 + e^3 + e^5 + (e^2 + e^6)(e^3 + e^4 + e^5 + e^0) + (e^3 + e^4)(e^5 + e^0)$$

$$d^1 = e^7 + e^2 + e^3 + e^4 + e^6 + (e^3 + e^0)(e^4 + e^5 + e^6 + e^1) + (e^4 + e^5)(e^6 + e^1)$$

$$d^2 = e^7 + e^3 + e^4 + e^5 + e^0 + (e^4 + e^1)(e^5 + e^6 + e^0 + e^2) + (e^5 + e^6)(e^0 + e^2)$$

$$d^3 = e^7 + e^4 + e^5 + e^6 + e^1 + (e^5 + e^2)(e^6 + e^0 + e^1 + e^3) + (e^6 + e^0)(e^1 + e^3)$$

$$d^4 = e^7 + e^5 + e^6 + e^0 + e^2 + (e^6 + e^3)(e^0 + e^1 + e^2 + e^4) + (e^0 + e^1)(e^2 + e^4)$$

$$d^5 = e^7 + e^6 + e^0 + e^1 + e^3 + (e^0 + e^4)(e^1 + e^2 + e^3 + e^5) + (e^1 + e^2)(e^3 + e^5)$$

$$d^6 = e^7 + e^0 + e^1 + e^2 + e^4 + (e^1 + e^5)(e^2 + e^3 + e^4 + e^6) + (e^2 + e^3)(e^4 + e^6)$$

$$d^7 = e^0 + e^1 + e^2 + e^3 + e^4 + e^5 + e^6 + e^7 + d^0 + d^1 + d^2 + d^3 + d^4 + d^5 + d^6$$

$G_4(X)$ is an 8, 4, 4 Hamming SECDED Code (even more miniature than the above codes), a code that could be incorporated when finer granularity is desired.

$$E0 = D0 + D1 + D3$$
$$E1 = D0 + D2 + D3$$
$$E2 = D1 + D2 + D3$$
$$E3 = E0 + E1 + E2 + D0 + D1 + D2 + D3$$

$$D0 = E0 + E1 + E3$$
$$D1 = E0 + E2 + E3$$
$$D2 = E1 + E2 + E3$$
$$D3 = D0 + D1 + D2 + E0 + E1 + E2 + E3$$

[D3 D2] [D1 D0] ST
[E0 E1] [E2 E3] UV

W X Y Z

DATA  0 1 2 3 4 5 6 7 8 9 A B C D E F
ECC   0 B D 6 E 5 3 8 7 C A 1 9 2 4 F

In some embodiments, each sensor may simultaneously transmit encoded data to all control centers via the orthogonal sub-networks. The control center processor(s) may input the coded data and validate it on the fly, then parse it or optionally store the encoded data in a memory for delayed processing or evaluation. If the received coded data is in error, it may be logged and error correction and recovery may be tried via algorithms or look up table, with the results logged. A decision tree of recovery actions may be activated. If no or only partial recovery is possible, then other processors may be queried for a successful copy of the data. The local control processor may attempt to isolate the root cause of the error and log it, then ratchet down the integrity of that link or component for on-going configuration control.

The algebraic encoding may also permit a dynamic encoded data stream be sensed repeatedly, monitoring the stability of the code word, finally latching data when the DATA and the ECC match, meaning that the Hamming Distance is stable over time. Control, sense, or any logic lines of less than eight bits may be padded, with zeros for example, to eight bits and encoded or replicated via alternate algebraic encodings in logic for protection against single event upsets (SEUs) as a "hardening" method.

Data transmission within the system may be protected during transfers over network channels via encoded data techniques. Data error events related to a system element such as a sensor, cable, or switch may be logged, even if data has been corrected. Data ports on sensors, controllers, networks, and processor modules may vary in data widths. Error control codes may take advantage of these differences. Data formats may thus be tailored to each channel. In some embodiments, each channel may have a preset parameter indicating the preferred formatting, preferred ECC, and procedure. This preset may be determined based on, for example, the most commonly expected type of error for the particular channel or component. Example formats are provided below. These options may be provided as parameters within the configuration table of each archive, for example, such that the control centers know how best to format data relative to the equipment manifest, network paths involved, and expected error modes.

EXAMPLE 1

Serial channels are resilient to random data errors:
$e^7e^6e^5e^4e^3e^2e^1\underline{e^0}$, $d^7d^6d^5\underline{d^4}$ $d^3d^2d^1d^0$, $e^7e^6e^5e^4e^3e^2e^1e^0$, $d^7\underline{d^6d^5}$ $d^4d^3d^2d^1d^0$

EXAMPLE 2

Byte wide channels are resilient to a single failing bit line:

| | | |
|---|---|---|
| $e^0 \ldots e^0$ | $d^0 \ldots d^0$ | |
| $e^1 \ldots e^1$ | $d^1 \ldots d^1$ | |
| $e^2 \ldots e^2$ | $d^2 \ldots d^2$ | |
| $e^3 \ldots e^3$ | $d^3 \ldots d^3$ | Can self-detect and self-correct any failing bit line. |
| $e^4 \ldots e^4$ | $d^4 \ldots d^4$ | |
| $e^5 \ldots e^5$ | $d^5 \ldots d^5$ | |
| $e^6 \ldots e^6$ | $d^6 \ldots d^6$ | |
| $e^7 \ldots e^7$ | $d^7 \ldots d^7$ | |

EXAMPLE 3

Parallel codewords are resilient to random data errors:

| | |
|---|---|
| $\underline{d^0d^0}\ d^0\ d^0$ | |
| $\underline{d^1}\ \underline{d^1}\ d^1\ d^1$ | |
| $d^2\ \underline{d^2}\ d^2\ d^2$ | |
| $d^3\ d^3\ d^3\ d^3$ | |
| $d^4\ d^4\ d^4\ d^4$ | |
| $d^5\ d^5\ \underline{d^5}d^5$ | Codewords can self-detect and self-correct up to two random errors. |
| $d^6\ d^6\ \underline{d^6}\ \underline{d^6}$ | |
| $d^7\ d^7\ d^7\ d^7$ | |
| $e^0\ e^0\ e^0\ e^0$ | |
| $e^1\ e^1\ e^1\ \underline{e^1}$ | |
| $e^2\ e^2\ e^2\ e^2$ | |
| $e^3\ e^3\ e^3\ e^3$ | |
| $e^4\ e^4\ e^4\ e^4$ | |
| $e^5\ e^5\ e^5\ e^5$ | |
| $e^6\ e^6\ e^6\ e^6$ | |
| $\underline{e^7}\ e^7\ e^7\ e^7$ | |

EXAMPLE 4

Data dispersed to four channels or devices is resilient to two simultaneous failures.

| | |
|---|---|
| $d^0\ d^0\ d^0\ d^0 \ldots d^0\ d^0\ d^0\ d^0$ | |
| $d^1\ d^1\ d^1\ d^1 \ldots d^1\ d^1\ d^1\ d^1$ | s Data can be recovered by evaluating |
| $d^2\ d^2\ d^2\ d^2 \ldots d^2\ d^2\ d^2\ d^2$ | equations su or by table-lookup via Table 1. |
| $d^3\ d^3\ d^3\ d^3 \ldots d^3\ d^3\ d^3\ d^3$ | Serial data can also be recovered if |
| $d^4\ d^4\ d^4\ d^4 \ldots d^4\ d^4\ d^4\ d^4$ | blocked properly. |
| $d^5\ d^5\ d^5\ d^5 \ldots d^5\ d^5\ d^5\ d^5$ | t missing |
| $d^6\ d^6\ d^6\ d^6 \ldots d^6\ d^6\ d^6\ d^6$ | |
| $d^7\ d^7\ d^7\ d^7 \ldots d^7\ d^7\ d^7\ d^7$ | |
| $e^0\ e^0\ e^0\ e^0 \ldots e^0\ e^0\ e^0\ e^0$ | |
| $e^1\ e^1\ e^1\ e^1 \ldots e^1\ e^1\ e^1\ e^1$ | u |
| $e^2\ e^2\ e^2\ e^2 \ldots e^2\ e^2\ e^2\ e^2$ | |
| $e^3\ e^3\ e^3\ e^3 \ldots e^3\ e^3\ e^3\ e^3$ | |
| $e^4\ e^4\ e^4\ e^4 \ldots e^4\ e^4\ e^4\ e^4$ | |
| $e^5\ e^5\ e^5\ e^5 \ldots e^5\ e^5\ e^5\ e^5$ | v missing |
| $e^6\ e^6\ e^6\ e^6 \ldots e^6\ e^6\ e^6\ e^6$ | |
| $e^7e^7e^7e^7 \ldots e^7e^7e^7e^7$ | |

For example, if the port and channel width for a given connection is 8 bits, then Example 2 might be a good format choice, in some embodiments. A 512-byte packet transmitted over the channel with a single bit-line presenting errors may get detected at the receiving end. A negative acknowledge in place of an acknowledge may let the sender know of the errors received and cause a follow-on packet made up of the corresponding 512 ECC bytes to be sent. Once the receiver has both the data packet and the ECC packet, it can analyze the two packets and correct the error bits in either or both.

With programmable sensors, controllers, etc. it is possible to alter format selection or try multiple formats on-the-fly if warranted. If the recovery algorithm determines that a different format, ECC, or procedure is more viable, it may log the results and change the parameters set in the configuration table for dynamic reconfiguration. For example, if a recovery algorithm determines that the recovery methods of Example 4 are better than that of Example 1 for addressing a particular type of error in a particular line or with respect to a particular sensor, the configuration table with respect to that particular line or sensor may be changed or updated. In this way, it is possible to match recovery formats with particular error modes. For example, one sensor may be erring or failing in one mode and a similar sensor may be erring or failing in a different mode. While the most commonly expected mode may be preset for both sensors in the configuration table, where the system determines that errors are occurring in a different mode, the configuration table may be updated to reflect a different recovery format.

Figure 7:
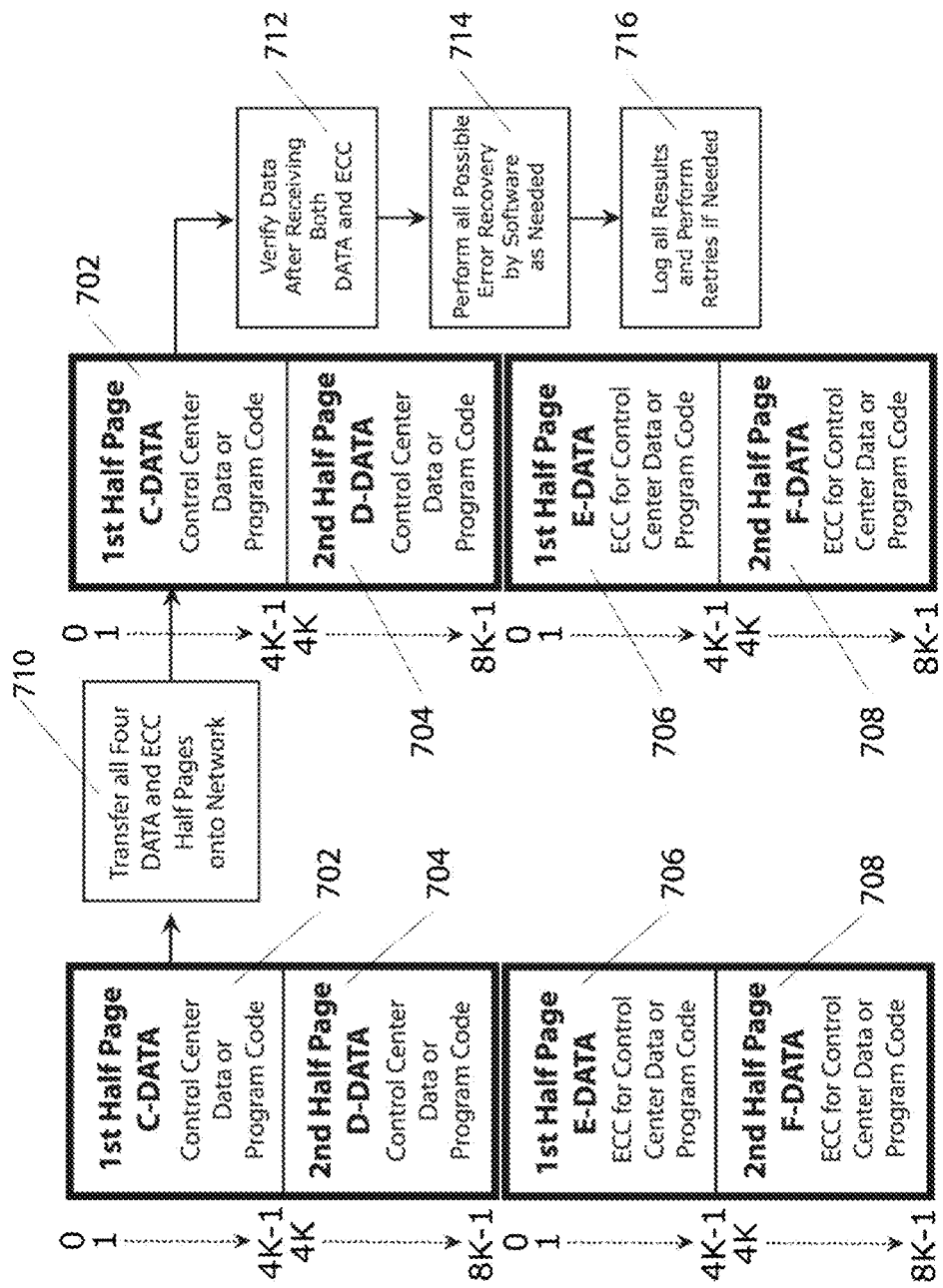
FIG. 7 is a flow diagram of a data transfer, according to one or more embodiments.

FIG. 7 illustrates a data transfer between control centers, controllers, archives, sensors, and/or other components of a system of the present disclosure, according to one or more embodiments. In general, control center data, program code data, sensor data, controller data, and/or other data to be transferred or stored within the system may be encoded to form ECC data. Both the original DATA and ECC data may be parsed into one or more parts, such as two halves, as described above with respect to FIG. 6. For example, the original DATA may be divided into C-DATA 702 and D-DATA 704. The ECC data may be divided into E-DATA 706 and F-DATA 708. To transfer the data, all four parts (C, D, E, and F) may be transferred across the network 710. When a component or device of the system receives the four components of the DATA and ECC data, the data may be verified 712 by equations or lookup table. If an error is discovered or suspected, error recovery may be performed 714 via one or more algorithms, for example. In some embodiments, data may be transmitted multiple times, in a burst of retries for example, so as to avoid the need for error recovery. This may be particularly useful where, for example, performance constraints and computing capability of the receiver may be low. The transfer(s), the verification, and any error correction steps may be recorded in the TLOE 716.

The table below shows a table lookup method for correcting single and double-bit errors for one embodiment using the $G_1(x)$ polynomial, as an example. In general, 1 and/or 2 bit error patterns for the polynomial $G_1(x)=1+x^3+x^4+x^5+x^8$ may be addressed by hexadecimal error syndrome values. There are 16 possible single bit errors and 120 possible double bit errors. For actual use, the table values may have bits set to ones that would toggle the DATA and ECC bits via the exclusive-or (XOR) logical operation. It is also possible to simply translate the results via logical operations or software lookup. In some embodiments, the code word for DATA and ECC data received at a node may be: $[CW_t]=[D_t]\ [E_t]=d^0d^1d^2d^3d^4d^5d^6d^7e^0e^1e^2e^3e^4e^5e^6e^7$, wherein $d^x$ represents a DATA bit and $e^x$ represents an ECC data bit.

$x^3+x^4+x^5+x^8$, for example. The circuit may use Boolean equations to locate errors instead of, or in addition to, the table lookup method described above. The following equations represent Boolean equations that may be used to determine errors in DATA bits with respect to the code word $d^0d^1d^2d^3d^4d^5d^6d^7e^0e^1e^2e^3e^4e^5e^6e^7$. Boolean equations for determining errors in ECC data bits with respect to the code word may be similar.

CDC-0013-061917

| SYN | BITS | SYN | BITS | SYN | BITS | SYN | BITS | SYN | BITS | SYN | BITS | SYN | BITS | SYN | BITS |
|---|---|---|---|---|---|---|---|---|---|---|---|---|---|---|---|
| 00 | — | 01 | E0 | 02 | E1 | 03 | E0E1 | 04 | E2 | 05 | E0E2 | 06 | E1E2 | 07 | D6E5 |
| 08 | E3 | 09 | E0E3 | 0A | E1E3 | 0B | — | 0C | E2E3 | 0D | — | 0E | D7E6 | 0F | D5E7 |
| 10 | E4 | 11 | E0E4 | 12 | E1E4 | 13 | — | 14 | E2E4 | 15 | D2D3 | 16 | — | 17 | — |
| 18 | E3E4 | 19 | D0E5 | 1A | — | 1B | — | 1C | — | 1D | — | 1E | D0D6 | 1F | — |
| 20 | E5 | 21 | E0E5 | 22 | E1E5 | 23 | D6E2 | 24 | E2E5 | 25 | D6E1 | 26 | D6E0 | 27 | D6 |
| 28 | E3E5 | 29 | D0E4 | 2A | D3D4 | 2B | — | 2C | — | 2D | — | 2E | — | 2F | D6E3 |
| 30 | E4E5 | 31 | D0E3 | 32 | D1E6 | 33 | — | 34 | — | 35 | — | 36 | — | 37 | D6E4 |
| 38 | D0E0 | 39 | D0 | 3A | — | 3B | D0E1 | 3C | D1D7 | 3D | D0E2 | 3E | — | 3F | D2D4 |
| 40 | E6 | 41 | E0E6 | 42 | E1E6 | 43 | — | 44 | E2E6 | 45 | — | 46 | D7E3 | 47 | — |
| 48 | E3E6 | 49 | — | 4A | D7E2 | 4B | D0D1 | 4C | E7E1 | 4D | — | 4E | D7 | 4F | D7E0 |
| 50 | E4E6 | 51 | — | 52 | D1E5 | 53 | — | 54 | D4D5 | 55 | D1D6 | 56 | — | 57 | — |
| 58 | — | 59 | — | 5A | — | 5B | D4E7 | 5C | — | 5D | — | 5E | D7E4 | 5F | — |
| 60 | E5E6 | 61 | — | 62 | D1E4 | 63 | — | 64 | D2E7 | 65 | — | 66 | — | 67 | D6E6 |
| 68 | — | 69 | D6D7 | 6A | — | 6B | D2D5 | 6C | — | 6D | — | 6E | D7E5 | 6F | — |
| 70 | D1E1 | 71 | D3E7 | 72 | D1 | 73 | D1E0 | 74 | — | 75 | — | 76 | D1E2 | 77 | D0D7 |
| 78 | — | 79 | D0E6 | 7A | D1E3 | 7B | — | 7C | — | 7D | — | 7E | D3D5 | 7F | — |
| 80 | E7 | 81 | E0E7 | 82 | E1E7 | 83 | D1D3 | 84 | E2E7 | 85 | — | 86 | — | 87 | D5E3 |
| 88 | E3E7 | 89 | — | 8A | — | 8B | D5E2 | 8C | — | 8D | D5E1 | 8E | D5E0 | 8F | D5 |
| 90 | E467 | 91 | — | 92 | — | 93 | — | 94 | — | 95 | D407 | 96 | D1D2 | 97 | — |
| 98 | — | 99 | — | 9A | — | 9B | D4E6 | 9C | — | 9D | — | 9E | — | 9F | D5E4 |
| A0 | E5E7 | A1 | — | A2 | — | A3 | — | A4 | D2E6 | A5 | — | A6 | — | A7 | D6E7 |
| A8 | D5D6 | A9 | D1D4 | AA | D2D7 | AB | — | AC | — | AD | — | AE | — | AF | D5E5 |
| B0 | — | B1 | D3E6 | B2 | — | B3 | — | B4 | — | B5 | — | B6 | D0D5 | B7 | — |
| B8 | — | B9 | D0E7 | BA | — | BB | — | BC | — | BD | — | BE | — | BF | D3D7 |
| C0 | E6E7 | C1 | D5D7 | C2 | — | C3 | — | C4 | D2D6 | C5 | — | C6 | — | C7 | — |
| C8 | D0D3 | C9 | — | CA | — | CB | D4E4 | CC | — | CD | — | CE | D7E7 | CF | D5E6 |
| D0 | — | D1 | D3D5 | D2 | — | D3 | — | D4 | D4E3 | D5 | — | D6 | D3D6 | D7 | — |
| D8 | — | D9 | D4E1 | DA | D4E0 | DB | D4 | DC | — | DD | — | DE | D0D2 | DF | D4E2 |
| E0 | D2E2 | E1 | D3E4 | E2 | D0D4 | E3 | — | E4 | — | E5 | D2E0 | E6 | D2E1 | E7 | — |
| E8 | — | E9 | — | EA | — | EB | — | EC | D2E3 | ED | — | EE | — | EF | — |
| F0 | D3E0 | F1 | D3 | F2 | D1E7 | F3 | D3E1 | F4 | D2E4 | F5 | D3E2 | F6 | — | F7 | — |
| F8 | — | F9 | D3E3 | FA | — | FB | D4E5 | FC | D4D6 | FD | D1D5 | FE | — | FF | — |

The table above shows hexadecimal syndrome values for potential single and double bit errors in the data represented by code word $d^0d^1d^2d^3d^4d^5d^6d^7e^0e^1e^2e^3e^4e^5e^6e^7$. A D # error may be representative of an error in the DATA, and an E # error may be representative of an error in the ECC data. In some embodiments, single and/or double bit error correction may be performed using the table with the following steps:

1. Receive DATA and ECC bytes
2. Read received DATA byte
3. Read received ECC byte
4. Re-calculate ECC byte
5. XOR ECC byte with recalculated ECC byte to obtain ECC Syndrome
6. If ECC Syndrome is zero, there is no error, loop to 1, otherwise
7. Evaluate error pattern (using table or Boolean equations)
8. XOR error bits with DATA and ECC data, loop to 1

Figure 8:
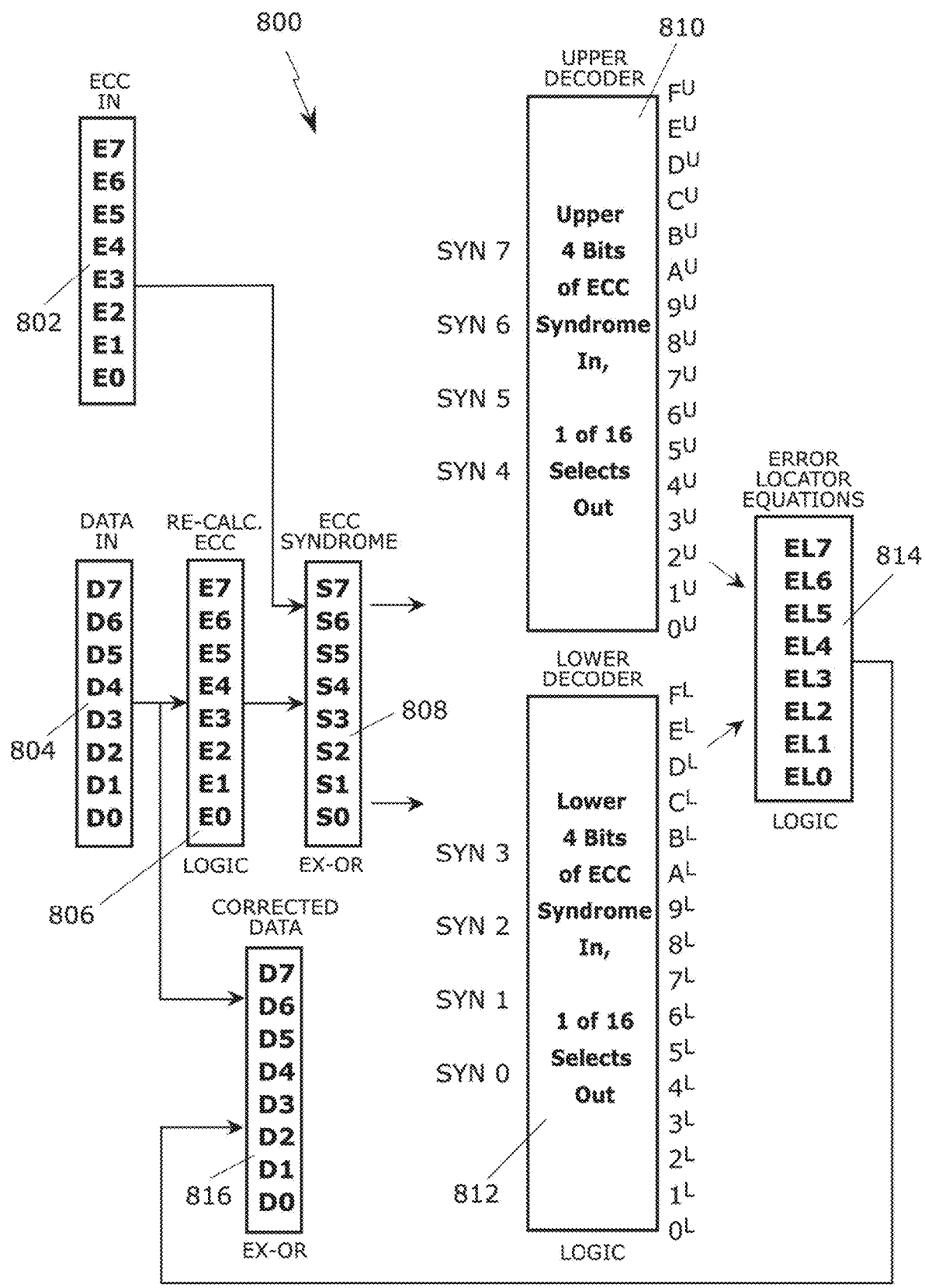
FIG. 8 is a schematic diagram of an error correction logic circuit, according to one or more embodiments.

In some embodiments, a circuit may be used to perform error correction with respect to single and double bit errors or other errors. FIG. 8 shows one embodiment of a circuit 800 that may be configured to perform single and double bit error correction with respect to the polynomial $G_1(x)=1+$ $EL7 = 0^U E^L + 3^U C^L + 4^U 6^L + 4^U A^L + 4^U C^L + 4^U E^L + 4^U F^L + 6^U 9^L + 6^U E^L + 7^U 1^L + 7^U 7^L + 9^U 5^L + A^U A^L + B^U F^L + C^U 1^L + C^U E^L$ $EL6 = 0^U 7^L + 1^U E^L + 2^U 3^L + 2^U 5^L + 2^U 6^L + 2^U 7^L + 2^U F^L + 3^U 7^L + 5^U 5^L + 6^U 7^L + 6^U 9^L A^U 7^L + A^U 8^L + C^U 3^L + D^U 6^L + F^U C^L$ $EL5 = 0^U F^L + 5^U 4^L + 6^U B^L + 7^U E^L + 8^U 7^L + 8^U B^L + 8^U D^L + 8^U E^L + 8^U F^L + 9^U F^L + A^U 8^L + A^U F^L + B^U 6^L + C^U F^L + D^U 1^L + F^U D^L$ $EL4 = 2^U A^L + 3^U F^L + 5^U 4^L + 5^U B^L + 9^U 5^L + 9^U B^L + A^U 9^L + C^U B^L + D^U 3^L + D^U 9^L + D^U A^L + D^U B^L + D^U F^L E^U 2^L + F^U B^L + F^U C^L$ $EL3 = 1^U 5^L + 2^U A^L + 7^U 1^L + 7^U E^L + 8^U 3^L + B^U 1^L + B^U F^L + C^U 8^L + D^U 1^L + D^U 6^L + E^U 1^L + F^U 0^L + F^U 1^L + F^U 3^L + F^U 5^L + F^U 9^L$ $EL2 = 1^U 5^L + 3^U F^L + 6^U 4^L + 6^U B^L + 9^U 6^L + A^U 4^L + A^U A^L + C^U 3^L + C^U 4^L + D^U D^L + E^U 0^L + E^U 4^L + E^U 5^L + E^U 6^L + E^U C^L + F^U A^L$ $EL1 = 3^U 2^L + 3^U C^L + 4^U B^L + 5^U 2^L + 5^U 5^L + 6^U 2^L + 7^U 0^L + 7^U 2^L + 7^U 3^L + 7^U 6^L + 7^U A^L + 8^U 3^L + 9^U 6^L + A^U 9^L + F^U 2^L + F^U D^L$ $$EL0 = 1^{U}9^{L} + 1^{U}E^{L} + 2^{U}9^{L} + 3^{U}1^{L} + 3^{U}8^{L} + 3^{U}9^{L} + 3^{U}B^{L} +$$
$$3^{U}D^{L} + 4^{U}B^{L} + 7^{U}7^{L} + 7^{U}9^{L} + B^{U}6^{L} + B^{U}9^{L} + C^{U}8^{L} +$$
$$D^{U}0^{L} + E^{U}2^{L}$$

It is to be appreciated that in the above Boolean equations, upper (U) and lower (L) identifiers signify upper and lower portions of the syndrome. The plusses (+) in the equations generally represent ORs. In general, one upper and lower combination may be found present in each of the DATA Boolean equations and in each of the ECC Boolean equations (not shown).

As shown in FIG. 8, ECC data 802 and DATA 804 may be received at a system node, for example. The DATA byte may be used to recalculate the ECC byte 806. The received ECC data and recalculated ECC data may be XORed to derive an ECC syndrome value 808. The syndrome value may be sent through upper 810 and lower 812 decoder logic to decode the upper and lower four bits of the syndrome, respectively. Boolean equations, such as those listed above, may then be used to locate the bit error(s) in the DATA and/or ECC data 814. Once the errors are located, the error bits may be XORed with the received DATA and/or ECC to obtain corrected data 816.

In other embodiments, other circuits may be used for other error correction algorithms. This may generally be referred to as "hardening" in the industry. The technique may apply to processor and memory design equally well. While hardware and software error correction embodiments described above provide examples using the $G_1(x)$, in general, the above-described software and hardware error correction methods may be used for $G_2$, $G_3$, and $G_4$ polynomials and/or other ECC formats as well.

In some embodiments, Cyclic Redundancy Code (CRC), hash value, or other similar error detection codes may be used in addition to the above-described error correction codes as a confirmation that data has been successfully transmitted, received, or recovered.

Some current compilers and processors may not be capable of handling executable encoded data code words as program code within a processor memory. However the program code can be mirrored with ECC data stored in a separate area of the processor memory for a routine re-loading or validation of the working processor code. Perhaps more recent microprocessor releases can load, validate, and execute encoded program code making that final last integrity check even more valid.

The above-described data mirroring and protection techniques may provide significant advantages over other methods. For example, hamming distances may be increased, probability of undetected errors may decrease, and probability of corrected errors may increase, as shown in the table below.

| Mirroring Method | Hamming Distance Hd Per Codeword | Probability of Undetected Error BER, 10 EE−10 | Random Bits Error Correction Per Byte | Probability of Corrected Error if BER, 10 EE−6 | Hd/Byte Figure of Merit |
|---|---|---|---|---|---|
| Non mirrored | 0 | ~10 EE−9 | 0 | 0 | 1 |
| Binary | 2 | 10 EE−24 | 0 | 0 | 1 |
| Algebraic 1 | 5 | 10 EE−59 | 2 | .999999999 | 2.5 |
| Algebraic 2 | 5 | 10 EE−59 | 2 | .999999999 | 2.5 |
| Algebraic 3 | 6 | 10 EE−70 | 2 | .999999999 | 3 |

While all four error correcting codes have similar capabilities, their mathematical differences may provide beneficial attributes when they are used in concert as in 3× or 4× replication, for example. Error patterns that may be problematic for one error correction code may be caught by another, for example. ECC $G_1(x)$ and ECC $G_2(x)$ may be particularly synergistic in this manner, as a particular example.

In general, the systems and methods of the present disclosure may provide for secure operation and error correction using a plurality of defined or predetermined rules. Some rules may ensure that commands and status are protected end-to-end. Other rules may help to ensure that network resiliency methods and redundant paths are available and used. Still other rules may perform or provide for other tasks and operations in other embodiments. According to some embodiments, the following set of rules can be followed as a guideline to achieve a desired authenticity and completeness of design for a rules-driven methodology. Generally, the following rules may be implemented in any suitable combination, and not all of the rules need be followed in every embodiment.

Rule 1. Original data within the system is recorded on the archive devices, whether compiled program instructions or pure data. The data is in code word format, even if loosely arranged. Before running the control system, this original data should be validated by checking the DATA versus the ECC. Any errors should be logged into the TLOE and/or configuration table, and if allowed, the system control should adjust for any errors of significance. Archive memory found to have errors should be flagged and reallocated to better performing memory space or be replaced as appropriate.

Rule 2. Subsequent data input to the control system or archive should enter in code word format, even if loosely arranged, then verified. Whenever verification is not possible, it should be noted in the configuration table and/or TLOE. Encoding should be initiated generally immediately and prior to use. Data output from the control system should also be in code word format, even if loosely arranged. The format should take the form desired by the targeted receiver.

Rule 3. Data generated by the control center applications, if not encoded by the processor output instructions, should be encoded as soon as generally possible by processor subroutines. Likewise, applications within mobile devices or any other devices should encode new data generally immediately upon generation.

Rule 4. Data to and from control centers, sensors, controllers, and archives should be encoded for transmission, and validated upon reception in the prescribed data format. Initial system parameters may be required. Any and all places where data is received and held should be considered a place for validation with correction or recovery. Specific commands may direct the controller to echo the location as a status. All operational events are logged. In the case of system communication over existing network protocol, validation with error handling and error logging may be difficult. Validation with correction or recovery without logging is preferable to no recovery at all.

Rule 5. All sensory, control, and error events are time-stamped, logged, and consolidated in the TLOE. Likewise, information read from the archive should have a timestamp.

Rule 6. Control data flowing through logic outside the scope of processor, microcode processor, or state machine can be protected via simple digital circuits executing encode, decode, erasure recovery, and random bit(s) error correction.

Rule 7. Master Controllers running simultaneously should agree on sensor inputs and other status. Data errors corrected should be verified against other available Master Controller inputs, if possible, prior to being used by the control system. Byzantine error resolution techniques may be necessary in this control system.

Rule 8. An accurate approximation of each component's error rate should be maintained.

Rule 9. Data transiting a network link or network element, such as a concentrator, may likely get buffered in place of flow-thru. The combination of data formats and ECC codes provide various capabilities to be resilient to both spurious errors and broken logic or data lines at the link level. Errors detected should be logged with error rate levels adjusted in the configuration table. The method used for successful error recovery should be noted in the configuration table and/or TLOE as well.

Rule 10. In a shadow or stand-by mode, the control system could run appropriate availability tests that moves data patterns to and from endpoints and network paths logging any found errors. Platform specific stand-by tests can be developed over time to optimize this capability and address evolving analytical applications.

Such a rule-driven methodology may provide a true end-to-end data protection capability throughout the system. In some embodiments, millions of sensor and control transmissions and storage accesses may occur per second. While the rules may vary in different embodiments, according to the particular application and requirements, the rules may be predetermined or predefined for the system and may be observed by all components of the system. With this rules-driven approach, the system may operate to react quickly to transient or spurious errors, sequential component failures, or larger systemic or cataclysmic events. Security of data and control may be improved as well.

Below is a simplified example system initialization utilizing the above rules, according to one or more embodiments.

1. Assemble master copies of all system programs and data.
2. Encode all assembled and compiled programs and data (Apply Rule 1)
3. Validate all Control Center to Archive paths. (Apply Rule 4)
4. Download all encoded programs and data into the system Archives. The Configuration Table would contain an installed equipment manifest. The Time Log of Events would be cleared. (Apply Rules 2 and 11)
5. Validate all Archive programs and data for integrity. (Apply Rules 3, and 4)
6. Boot all Control Center processors via Archives. (Apply Rule 4)
7. Validate all Network Paths via Control Processors (Apply Rules 4 and 9)
8. Use Control Processors to Test all Instrumentation, Sensors and Controllers. (Apply Rules 3, 4, 5 and 6)
9. Run Control Processor System Diagnostics. (Apply Rules 3, 4, 5, 6, 7, 8, 9 and 10)
10. Control Processors Validate and Test all Mobile Devices (Apply Rules 1, 2, 3, 4, 5, 6, and 7)
11. Control Processors Validate and Test Navigation and Communications Equipment. (Apply Rules 1, 2, 3, 4 5, 6 and 7)
12. Control Processors Select a Master Controller and Activate the System Below is a simplified example system run-time operation utilizing the above rules, according to one or more embodiments.

1. Control Centers Gather all Sensor and Instrumentation Status. (Apply Rule 2)
2. Control Centers Validate all Input Status for System Errors and Log the Results. (Apply Rules 2, 4, and 9)
3. Control Centers Compute Actions Using Valid Input Data. (Apply Rules 6 and 7)
4. Test for Errors, If Yes go to 5, Otherwise got to 8.
5. Resolve. (Apply Rules 6 and 7)
6. Log Results and Reconfigure if Appropriate. (Apply Rules 2, 3, 4 and 5)
7. Notify as Necessary (Apply Rule 3)
8. Master Controller Control Center Functions Controllers and Instrumentation. (Apply Rules 3, 4 and 9)
9. Control Centers Update Archives with Log and Configuration Information. (Apply Rules 3, 4, 5 and 9)
10. Control Centers Check Results of On-Line Tests. (Apply Rules 7 and 10) Validate Program Code Prior to Next Status/Control Cycle. (Apply Rule 10)
11. Go to 1.

Another important consideration is that a data path within a network topology requiring many multiple links may require the data to be captured, verified, and retransmitted at numerous, if not each, interconnecting nodes. With robust data validation, correction, and recovery methods of the present disclosure, the data may be recovered in situ so as to avoid the delay and bandwidth losses of requesting retransmission or alternative path transmission from the source.

Figure 9:
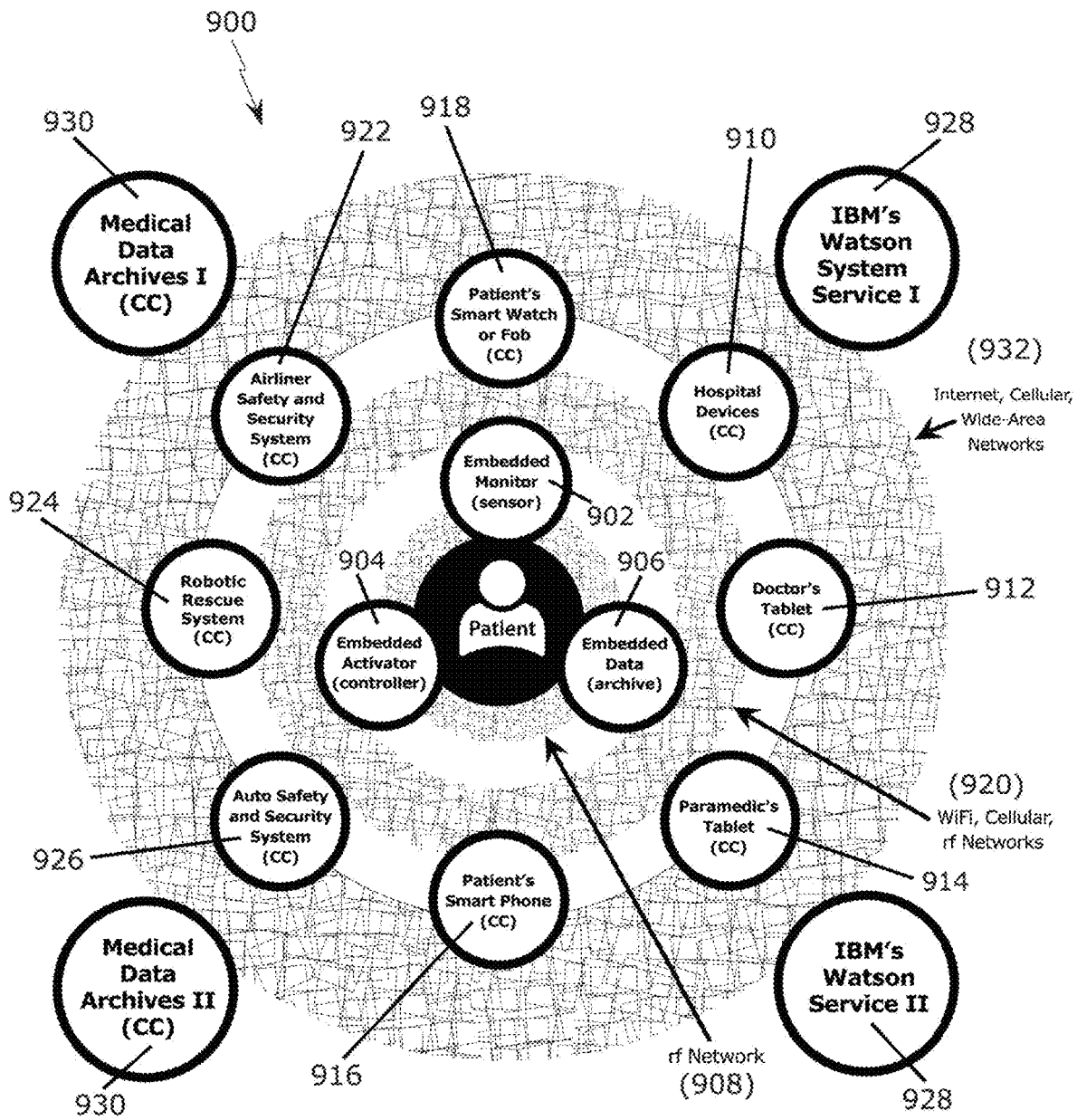
FIG. 9 is a schematic diagram of a healthcare system of the present disclosure, according to one or more embodiments.

Turning now to FIG. 9, another embodiment of the present disclosure is shown. In general, a system of the present disclosure, such as that of FIG. 1, may be applied in a healthcare information environment. In a healthcare information environment, a plurality of devices and systems may process and/or store data related to a patient. Such devices and systems may include, for example, medical scanners, DNA decoder ASICs, embedded personal medical devices and implants, smart watches and phones, tablets and other personal computers, expert systems, cloud data archives, and other professional medical systems. In some embodiments, a system 900 of the present disclosure may provide for communication and cooperation among the various devices and systems storing and processing patient data. The system 900 may operate using a variety of different network connections for local and remote devices. The system 900 may generally provide for processing and transfer of patient data with error correction, as described above.

For example, a patient's medical implant may monitor and provide various types of electrical, mechanical, and/or medicinal control. Medical implants may store personal medical data, including medication data, care history, allergies, DNA data, and other data. A medical implant may have a sensor 902, a controller 904, and an archive 906. The components of one or more medical implants may communicate over a first network 908, which may be a radio frequency (RF) network or other network. Moreover, other devices, which may be remote or local devices, such as a hospital device 910, a doctor's tablet 912, a paramedic's tablet 914, the patient's smartphone 916, the patient's smart watch 918, and/or other devices, may store and/or process information related to the patient's care. In some embodiments, these devices may communicate with one another and/or with a medical implant over a second network 920, which may be a WiFi, cellular, RF, or other network. Other systems, such as an airliner safety and security system 922, a robotic rescue system 924, and an automatic safety and security system 926, and/or other medical systems may communicate with the devices and/or medical implant over the second network 920 as well, as shown in FIG. 9. Each of these systems and devices may operate similar to the control centers described above with respect to FIG. 1. In some embodiments, other medical systems, such as but not limited to IBM's Watson System Service 928, and archives 930 may communicate with the devices and/or with one another over a third network 932, which may be an Internet, cellular, wide area network, and/or other network. These systems may operate as control centers in some embodiments. In other embodiments, the system 900 may include other sensors, such as inputs from personal health devices such as watches or bracelets, input applications that receive medical alerts, or communications from other control centers such as clinics, physicians, or experts systems.

Data may generally be transferred among the various devices and systems of FIG. 9 using the above-described DATA and ECC methods in order to maintain data in encoded form, provide for a suitable level of redundancy, and to allow for error analysis and correction. The system 900 may additionally follow all or a portion of the rules described above. For example, when data is transferred from an embedded activator to a doctor's tablet, and ultimately to a medical archive, the above-described rules may be applied.

In some embodiments, the system 900 may include one or more TLOEs and/or one or more configuration tables. For example, a TLOE and configuration table may be provided and maintained with respect to each patient, each location (such as a health care clinic location or hospital location), and/or each attending medical staff or user of the system. In addition to a name, location in the system, part number, model number, serial number, manufacturer, build date, software revision level, insertion date, power-on hours, power-on hour limit, capable operational modes, allowable error status, allowable error rates, current error rates, preferred ECC codes, preferred ECC procedures, rank in redundancy level, and/or re-activation quality level, a configuration table with respect to the system 900 may include personal medical information for the owner of the device, and/or other information.

In some embodiments, decoded data transmissions at end points may present a data integrity certification receipt by listing a log of all data bytes corrected, deemed uncorrectable, or missing. Likewise a text page may be color coded to denote (or may otherwise indicate) corrections, deletions, or errors. In the case of emergency medical applications even the partial data may be useful. Moreover, the certification may be used to denote that end-to-end data is valid and legal.

In some embodiments, a programmable network link may employ multiple codes and formats in succession in order to advance through a defective link in a network or an end-to-end transfer. In system processing equipment, the advantage may improve data latency whether memory-to-memory, memory-to-processor, or processor-to-memory. In external networks, the advantage may be improved data availability where availability is critical. Soft decoding is a term used to describe algorithmic methods implemented to allow software to analyze an error situation and tailor a set of recovery tries that would optimize a solution. Once a combination solution is found successful, it may be logged in a configuration table and re-applied earlier going forward. Where availability is paramount, software decoding may be considered given the multiple choices of codes and formats available. Many attempts could occur per second without being a noticeable factor. In some embodiments, this algorithm could be done interactively with the on-site provider issuing verbal "continues" until there is enough critical information accumulated to proceed. Audio and visual methods could be incorporated in this regard following existing sanitary trends.

As an example application, consider a doctor working remotely with a patient hundreds of miles from the nearest hospital and hundreds of miles from a data center where patient records are kept. The doctor may be taking samples and transmitting digital results to the hospital. The doctor and the hospital may be simultaneously acquiring the patient's records from remote cloud storage centers. Everything may operate interactively as a system, according to the present disclosure. The network fabric may be a combination of many different physical networks. With the data formatted with encoding, errors may be caught and data successfully recovered. Even the handheld tablet or smart phone used by the doctor may successfully encode and validate critical data generated in this rule-based system. The small overhead in time may be relatively unnoticeable, and worth the assurance of availability and correctness. This rules-driven control system may provide a Quality of Service (QOS) not currently available. Most importantly, it may improve availability with qualitative validation and certification. And it may provide validated partial information even in the midst of sparse or unreliable information, all of which could be of critical importance.

Since data security has been the primary concern for both financial and healthcare records, these various encoding and formatting methods may be used to enhance financial and personal healthcare data security. In some embodiments, the system may be integrated with existing security, hash, or encryption algorithms. For example, any or all of the following methods may be used to enhance security in the system:

1. Note that all four encoding methods have 8-bit byte granularity. Any sequence of encoding operators could be used on a byte-by-byte basis on an object of any length as long as the receiver on read-back knew or had the means to calculate the pattern sequence used for output. Likewise, distribution can be via row or columns relative to the 4-bit by 4-bit codeword matrix detailed within the Mathematical Analysis description pages.
2. All four encoding methods will produce different Cyclic Redundancy Codes (CRC), encrypted data and hash values. This can help make sure that illegal intentional data modifications can't be hidden by other intentional corruptions planted elsewhere in an inconspicuous data area.
3. Hash, encryption, and CRC calculations could include the original data plus any or all of the other mirrors without keeping the extra redundant data. This is perhaps an extreme form of "salting" the data.
4. Multiple hash values, encrypted data, and CRC values can be saved representative of the other functions.
5. True data could be converted to $G_1(X)$ data, then the $G_1(X)$ data could be converted to $G_2(X)$ data, then the $G_2(X)$ data could be converted to $G_3(X)$ data, then the $G_3(X)$ data could be converted to . . . and so on. Or a subset of these equations may be used. Decoding would be to either reverse the cycle or, having known the sequence, make a final translation back to original data. Any included errors that occur along the way will never be greater than the original 8-bit data byte.
6. Decoding functions could be used for encoding and encoding functions for decoding.

Systems and methods of the present disclosure may bring improved integrity to DNA or other data objects that are intrinsically susceptible to errors. Creating code words using any of the algebraic generators $G_1(x)$, $G_2(x)$ or $G_3(x)$ may provide improved integrity. Otherwise a new compact error control code for DNA was developed that provides improved efficiency, redundancy, and resiliency. It is based upon 4-bit symbols and may appear as AA'-TT' and GG'-CC' where A, A', T, T', G, G', C and C' are code words with algebraic properties.

Systems and rules-driven methods of the present disclosure may provide improved governance of availability, reliability, integrity, and resiliency with respect to a healthcare system or other system. Conventional non-integrated and non-encoded approaches may not provide the same benefits. Systems and methods of the present disclosure may provide a system wherein healthcare data is protected from its time and place of origin, and anytime and anywhere it is needed. Moreover, these systems and methods may give confidence to both patients and physicians that their information is accurate and protected.

In some embodiments, the systems of FIGS. 1 and 9 may be combined to benefit airlines accommodating medical emergencies aloft in a more standard and professional manner via access to remote assistance and data via this data protection technology.

It may be appreciated that radiation from space and other physical phenomenon may affect logic and memory circuits in critical operational equipment. There are several different physical causes with the results being either a bit-flip in a circuit or memory cell with occasional physical circuit or memory damage. These are called Single Effect Upsets (SEUs) or Single Effect Events (SEEs) in the industry. Conventionally, aerospace digital systems harden logic circuits against SEUs or SEEs via simple voting techniques. However, systems and methods of the present disclosure may improve on these designs. Both software lookup tables and new error correction logic circuits are presented.

For purposes of this disclosure, any system described herein may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, a system or any portion thereof may be a minicomputer, mainframe computer, personal computer (e.g., desktop or laptop), tablet computer, mobile device (e.g., personal digital assistant (PDA) or smart phone) or other hand-held computing device, server (e.g., blade server or rack server), a network storage device, a microprocessor, a vector or SIMD processor, a graphical processor or quantum processor, or any other suitable device or combination of devices and may vary in size, shape, performance, functionality, and price. A system may include volatile memory (e.g., random access memory (RAM)), one or more processing resources such as a central processing unit (CPU) or hardware or software control logic, ROM, and/or other types of nonvolatile memory (e.g., EPROM, EEPROM, etc.). A basic input/output system (BIOS) can be stored in the non-volatile memory (e.g., ROM), and may include basic routines facilitating communication of data and signals between components within the system. The volatile memory may additionally include a high-speed RAM, such as static RAM for caching data.

Additional components of a system may include one or more disk drives or one or more mass storage devices, one or more network ports for communicating with external devices as well as various input and output (I/O) devices, such as a keyboard, a mouse, touchscreen and/or a video display. Mass storage devices may include, but are not limited to, a hard disk drive, floppy disk drive, CD-ROM drive, smart drive, flash drive, or other types of non-volatile data storage, a plurality of storage devices, a storage subsystem, or any combination of storage devices. A storage interface may be provided for interfacing with mass storage devices, for example, a storage subsystem. The storage interface may include any suitable interface technology, such as EIDE, ATA, SATA, and IEEE 1394. A system may include what is referred to as a user interface for interacting with the system, which may generally include a display, mouse or other cursor control device, keyboard, button, touchpad, touch screen, stylus, remote control (such as an infrared remote control), microphone, camera, video recorder, gesture systems (e.g., eye movement, head movement, etc.), speaker, LED, light, joystick, game pad, switch, buzzer, bell, and/or other user input/output device for communicating with one or more users or for entering information into the system. These and other devices for interacting with the system may be connected to the system through I/O device interface(s) via a system bus, but can be connected by other interfaces such as a parallel port, IEEE 1394 serial port, a game port, a USB port, an IR interface, etc. Output devices may include any type of device for presenting information to a user, including but not limited to, a computer monitor, flat-screen display, or other visual display, a printer, and/or speakers or any other device for providing information in audio form, such as a telephone, a plurality of output devices, or any combination of output devices.

A system may also include one or more buses operable to transmit communications between the various hardware components. A system bus may be any of several types of bus structure that can further interconnect, for example, to a memory bus (with or without a memory controller) and/or a peripheral bus (e.g., PCI, PCIe, AGP, LPC, etc.) using any of a variety of commercially available bus architectures.

One or more programs or applications may be stored in one or more of the system data storage devices. Generally, programs may include routines, methods, data structures, other software components, etc., that perform particular tasks or implement particular abstract data types. Programs or applications may be loaded in part or in whole into a main memory or processor during execution by the processor. One or more processors may execute applications or programs to run systems or methods of the present disclosure, or portions thereof, stored as executable programs or program code in the memory, or received from the Internet or other network. Any commercial or freeware web browser or other application capable of retrieving content from a network and displaying pages or screens may be used. In some embodiments, a customized application may be used to access, display, and update information. A user may interact with the system, programs, and data stored thereon or accessible thereto using any one or more of the input and output devices described above.

A system of the present disclosure can operate in a networked environment using logical connections via a wired and/or wireless communications subsystem to one or more networks and/or other computers. Other computers can include, but are not limited to, workstations, servers, routers, personal computers, microprocessor-based entertainment appliances, peer devices, or other common network nodes, and may generally include many or all of the elements described above. Logical connections may include wired and/or wireless connectivity to a local area network (LAN), a wide area network (WAN), hotspot, a global communications network, such as the Internet, and so on. The system may be operable to communicate with wired and/or wireless devices or other processing entities using, for example, radio technologies, such as the IEEE 802.xx family of standards, and includes at least Wi-Fi (wireless fidelity), WiMax, and Bluetooth wireless technologies. Communications can be made via a predefined structure as with a conventional network or via an ad hoc communication between at least two devices.

Hardware and software components of the present disclosure, as discussed herein, may be integral portions of a single computer or server or may be connected parts of a computer network. The hardware and software components may be located within a single location or, in other embodiments, portions of the hardware and software components may be divided among a plurality of locations and connected directly or through a global computer information network, such as the Internet. Accordingly, aspects of the various embodiments of the present disclosure can be practiced in distributed computing environments where certain tasks are performed by remote processing devices that are linked through a communications network. In such a distributed computing environment, program modules may be located in local and/or remote storage and/or memory systems.

As will be appreciated by one of skill in the art, the various embodiments of the present disclosure may be embodied as a method (including, for example, a computer-implemented process, a business process, and/or any other process), apparatus (including, for example, a system, machine, device, computer program product, and/or the like), or a combination of the foregoing. Accordingly, embodiments of the present disclosure may take the form of an entirely hardware embodiment, an entirely software embodiment (including firmware, middleware, microcode, hardware description languages, etc.), or an embodiment combining software and hardware aspects. Furthermore, embodiments of the present disclosure may take the form of a computer program product on a computer-readable medium or computer-readable storage medium, having computer-executable program code embodied in the medium, that define processes or methods described herein. A processor or processors may perform the necessary tasks defined by the computer-executable program code. Computer-executable program code for carrying out operations of embodiments of the present disclosure may be written in an object oriented, scripted or unscripted programming language such as Java, Perl, PHP, Visual Basic, Smalltalk, C++, or the like. However, the computer program code for carrying out operations of embodiments of the present disclosure may also be written in conventional procedural programming languages, such as the C programming language or similar programming languages. A code segment may represent a procedure, a function, a subprogram, a program, a routine, a subroutine, a module, an object, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

In the context of this document, a computer readable medium may be any medium that can contain, store, communicate, or transport the program for use by or in connection with the systems disclosed herein. The computer-executable program code may be transmitted using any appropriate medium, including but not limited to the Internet, optical fiber cable, radio frequency (RF) signals or other wireless signals, or other mediums. The computer readable medium may be, for example but is not limited to, an electronic, magnetic, optical, electromagnetic, infrared, quantum, or semiconductor system, apparatus, or device. More specific examples of suitable computer readable medium include, but are not limited to, an electrical connection having one or more wires or a tangible storage medium such as a portable computer diskette, a hard disk, a random access memory (RAM), a read-only memory (ROM), an erasable programmable read-only memory (EPROM or Flash memory), a compact disc read-only memory (CD-ROM), or other optical or magnetic storage device. Computer-readable media includes, but is not to be confused with, computer-readable storage medium, which is intended to cover all physical, non-transitory, or similar embodiments of computer-readable media.

Various embodiments of the present disclosure may be described herein with reference to flowchart illustrations and/or block diagrams of methods, apparatus (systems), and computer program products. It is understood that certain blocks of the flowchart illustrations and/or block diagrams, and/or combinations of blocks in the flowchart illustrations and/or block diagrams, can be implemented by computer-executable program code portions. These computer-executable program code portions may be provided to a processor of a general purpose computer, special purpose computer, or other programmable data processing apparatus to produce a particular machine, such that the code portions, which execute via the processor of the computer or other programmable data processing apparatus, create mechanisms for implementing the functions/acts specified in the flowchart and/or block diagram block or blocks. Alternatively, computer program implemented steps or acts may be combined with operator or human implemented steps or acts in order to carry out an embodiment of the invention.

Additionally, although a flowchart or block diagram may illustrate a method as comprising sequential steps or a process as having a particular order of operations, many of the steps or operations in the flowchart(s) or block diagram(s) illustrated herein can be performed in parallel or concurrently, and the flowchart(s) or block diagram(s) should be read in the context of the various embodiments of the present disclosure. In addition, the order of the method steps or process operations illustrated in a flowchart or block diagram may be rearranged for some embodiments. Similarly, a method or process illustrated in a flow chart or block diagram could have additional steps or operations not included therein or fewer steps or operations than those shown. Moreover, a method step may correspond to a method, a function, a procedure, a subroutine, a subprogram, etc.

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an element may still actually contain such element as long as there is generally no significant effect thereof.

Systems and methods of the present disclosure provide for improved control system design and methods capable of surviving spurious random errors and sequential catastrophic component failure. We have long been advised that our electronics will reach the point of miniaturization whereby quantum effects would cause considerable random errors. It seems that we have encountered other natural phenomena, aside from dealing with quantum effects. These are nominally seen as single bit errors and are aggressively addressed here with new error correction codes and techniques. Systems of the present disclosure may reconfigure themselves in the event of catastrophic damage via electromechanical failure, damage caused by environmental events, collision, sabotage, and/or other unexpected causes including control system failure. Conventional multiple failover concepts must give way to new more integrated systems with the ability to rapidly reconfigure using all of the available system components.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

I claim:

1. A system comprising:
   two control centers communicably coupled over a network; and
   at least one sub-network arranged orthogonal to the network, the sub-network communicably coupling each of the control centers to each of:
     a sensor receiving sensed data; and
     a controller controlling one or more operations based on the sensed data;
     wherein the sensor and controller are communicably coupled together over the at least one orthogonal sub-network; and
   an archive storing as non-transitory computer readable media:
     a configuration table storing configuration data for each of the control centers, sensor, controller, and archive, wherein the configuration data includes a preferred error correction code, and at least one preferred error correction procedure; and
     a real-time time log of events storing actions performed by the control centers, sensor, controller, and archive.

2. The system of claim 1, wherein there is a minimum redundancy of two for each of the control centers, sensor, controller, and archive, including the configuration table and the real-time time log.

3. The system of claim 2, wherein the system may be reduced to a minimum configuration that is power-saving.

4. The system of claim 2, wherein all data is algebraically replicated by at least one generator formula and stored within at least one redundant archive.

5. The system of claim 4, further including rules for algebraically validating all data and all algebraically replicated data.

6. The system of claim 4, wherein if the system detects more than a set level of errors at a given system component, the system may override the preferred error code procedure and use any error correction code or combination of error correction codes to correct data.

7. The system of claim 4, wherein after the data has been corrected, the preferred error code procedure is reset.

8. The system of claim 4, where all redundant components are continually being exercised and rated.

9. The system of claim 5, wherein all transmission between system components is by algebraically replicated data, where system components include at least the control centers, sensor, controller, archive, configuration table and the real-time time log.

10. The system of claim 9, wherein all data is algebraically replicated when transmitted from the system to a source external to the system, and all data is algebraically validated when received by the system from a source external to the system the system.

11. The system of claim 9, wherein any one of each of the system component types can execute any critical application in combination with the rest of the system components.

12. The system of claim 9, wherein processors of the control centers execute in parallel to determine which of a plurality of system component types to accept.

13. The system of claim 12, where the determination is based on comparative algebraic validation.

14. The system of claim 9, wherein algebraically mirrored error control codewords are used to detect and correct random data errors within data bytes in transit at component boundaries, and within data bytes in storage.

15. The system of claim 14, wherein the system records error counts and updated status in the configuration table and in the real-time time log.

16. The system of claim 15, where the system detects data transfers between nodes experiencing hard bit failures and recovers the data using a second data transfer of algebraically replicated data.

17. The system of claim 16, wherein the component receiving the data packets generates a corrected data packet.

18. The system of claim 17, where the corrected data packet is generated by error correction.

19. The system of claim 17, where the corrected data packet is generated by direct translation.

20. The system of claim 9, wherein algebraically mirrored error control codewords are used to detect and recover data errors and data erasures within data packets in transit at component boundaries, and within data packets in storage.

* * * * *